(12) United States Patent
Sasaki

(10) Patent No.: US 10,607,996 B1
(45) Date of Patent: Mar. 31, 2020

(54) CONSTRUCTION OF INTEGRATED CIRCUITRY, DRAM CIRCUITRY, A METHOD OF FORMING A CONDUCTIVE LINE CONSTRUCTION, A METHOD OF FORMING MEMORY CIRCUITRY, AND A METHOD OF FORMING DRAM CIRCUITRY

(71) Applicant: Micron Technology, Inc., Boise, ID (US)

(72) Inventor: Takashi Sasaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,634

(22) Filed: Dec. 26, 2018

(51) Int. Cl.
*H01L 23/528* (2006.01)
*H01L 21/02* (2006.01)
*H01L 23/522* (2006.01)
*H01L 27/108* (2006.01)
*H01L 21/768* (2006.01)

(52) U.S. Cl.
CPC .. *H01L 27/10823* (2013.01); *H01L 21/76829* (2013.01); *H01L 27/10885* (2013.01); *H01L 27/10891* (2013.01)

(58) Field of Classification Search
None
See application file for complete search history.

(56) References Cited

U.S. PATENT DOCUMENTS

| 2015/0056801 | A1* | 2/2015 | Park | H01L 21/76814 438/655 |
| 2018/0301412 | A1 | 10/2018 | Borsari | |
| 2018/0342520 | A1* | 11/2018 | Chun | H01L 29/4236 |
| 2019/0348418 | A1* | 11/2019 | Hwang | H01L 21/76897 |

OTHER PUBLICATIONS

Kane et al.,"Use of SiBN and SiBON Films Prepared by Plasma Enhanced Chemical Vapor Deposition from Borazine as Interconnection Dielectrics", The Electrochemical Society vol. 144, No. 2, Feb. 1997, United States, pp. 658-663.
Kim et al., "A Highly Manufacturable Low-k ALD-SiBN Process for 60mm NAND Flash Devices and Beyond", IEEE, 2004, United States, pp. 42.5.1-42.5.4.
U.S. Appl. No. 16/399,348, filed Apr. 30, 2019, by Kim et al.
U.S. Appl. No. 16/148,148, filed Oct. 1, 2018, by Iwaki et al.

* cited by examiner

*Primary Examiner* — Khaja Ahmad
(74) *Attorney, Agent, or Firm* — Wells St. John P.S.

(57) ABSTRACT

A construction of integrated circuitry comprises a horizontal longitudinally-elongated conductive line. A horizontal longitudinally-elongated void space extends longitudinally along opposing longitudinal sides of the conductive line. The void space along each of the opposing longitudinal sides has cyclically varying height longitudinally along the conductive line. Methods independent of the above structure are disclosed.

19 Claims, 38 Drawing Sheets

CONSTRUCTION OF INTEGRATED CIRCUITRY, DRAM CIRCUITRY, A METHOD OF FORMING A CONDUCTIVE LINE CONSTRUCTION, A METHOD OF FORMING MEMORY CIRCUITRY, AND A METHOD OF FORMING DRAM CIRCUITRY

TECHNICAL FIELD

Embodiments disclosed herein pertain to constructions of integrated circuitry, to DRAM circuitry, to methods of forming a conductive line construction, to methods of forming memory circuitry, and to methods of forming DRAM circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry. Regardless, a conductive via is an elevationally-extending (e.g., vertical) conductor that is used to electrically connect upper and lower capacitors, transistors, and other integrated circuitry components together. Such may be patterned in an array. As conductive vias get closer and closer to adjacent circuit components, undesired parasitic capacitance increases and can adversely impact circuit operation.

DETAILED DESCRIPTION OF EXAMPLE EMBODIMENTS

Figure 1:
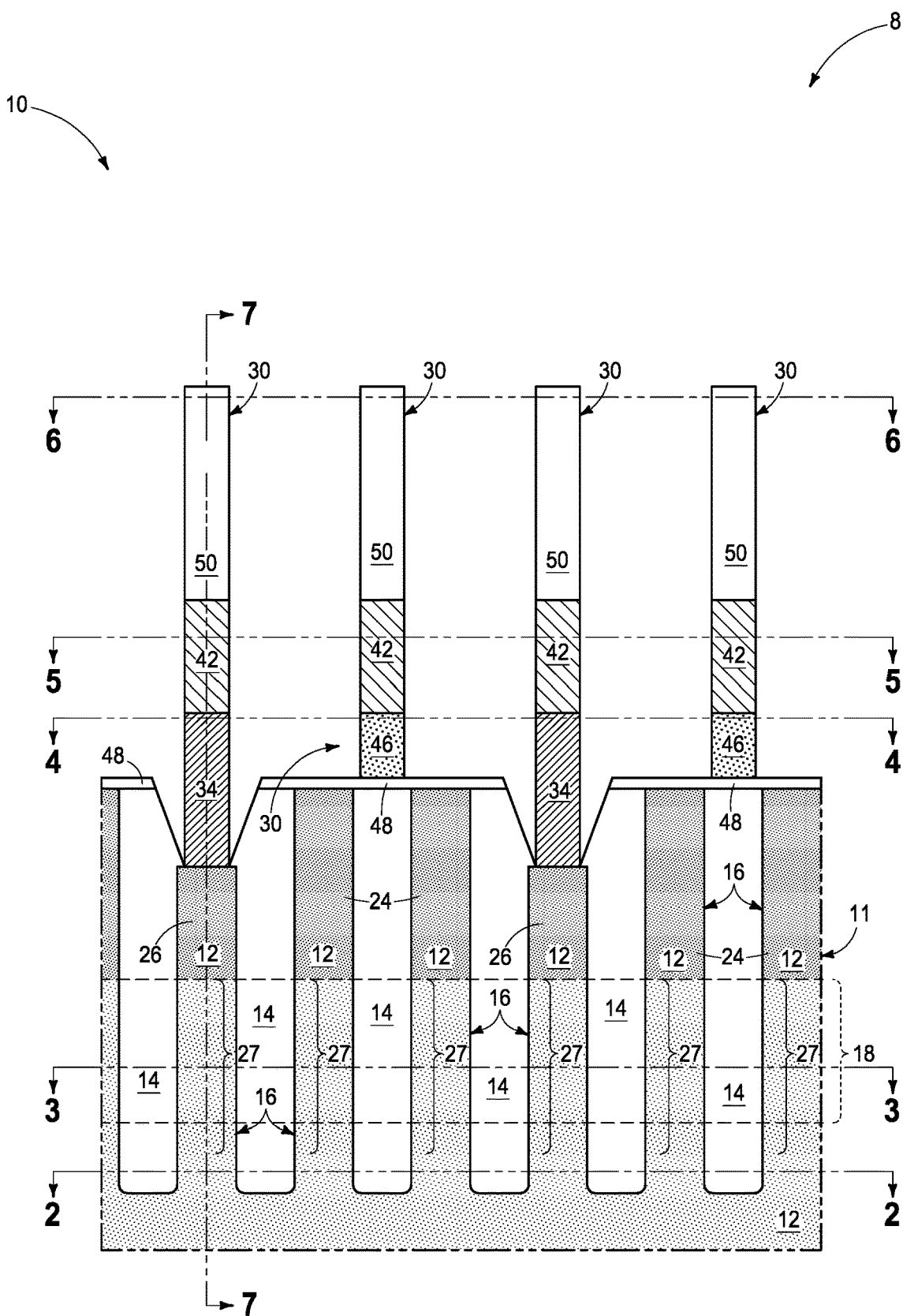
FIG. 1 is a diagrammatic cross-sectional view of a portion of a DRAM construction in process in accordance with some embodiments of the invention and is taken through line 1-1 in FIGS. 2-6 and 9.
Figure 2:
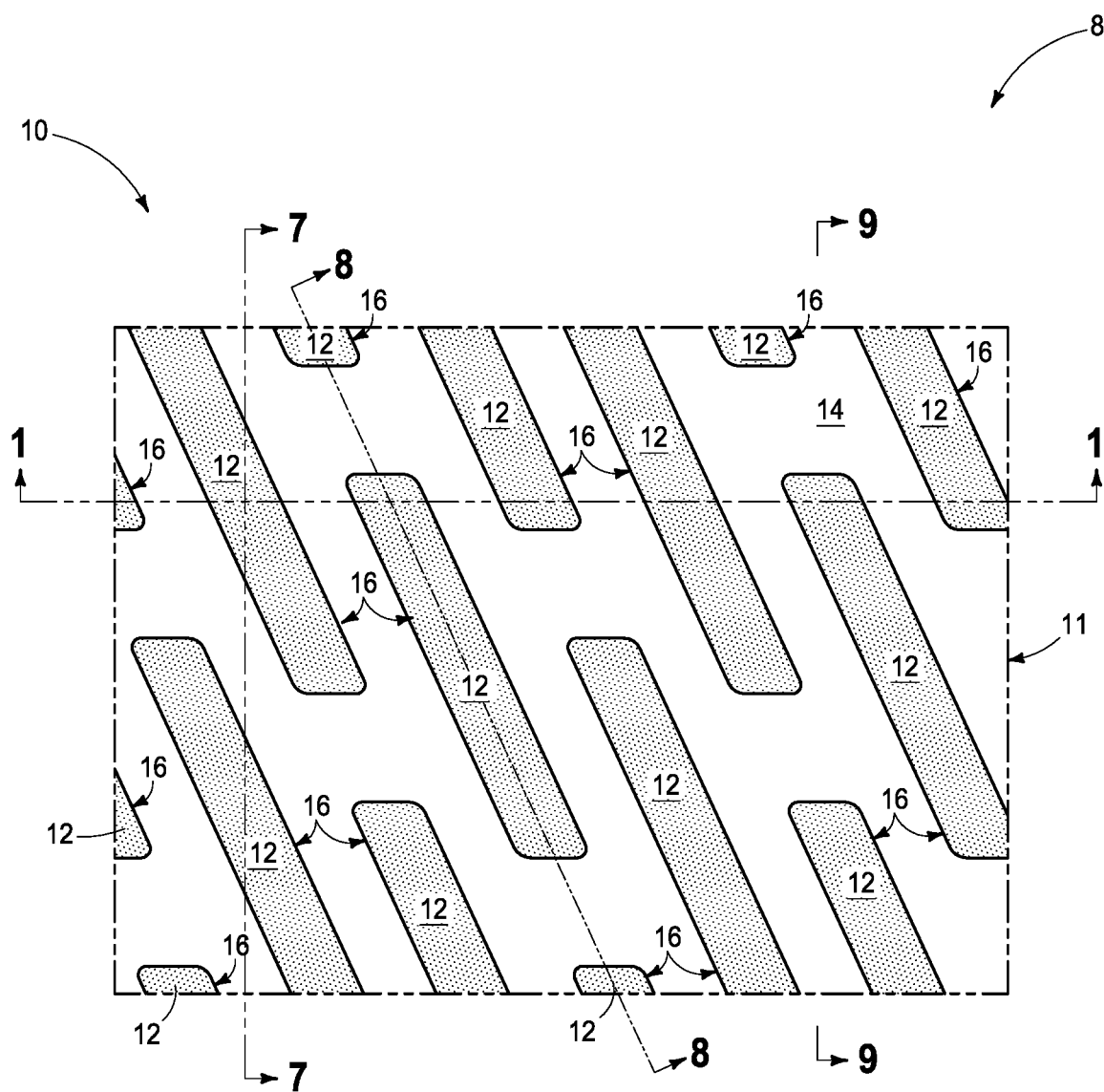
FIG. 2 is a view taken through line 2-2 in FIGS. 1 and 7-9.
Figure 3:
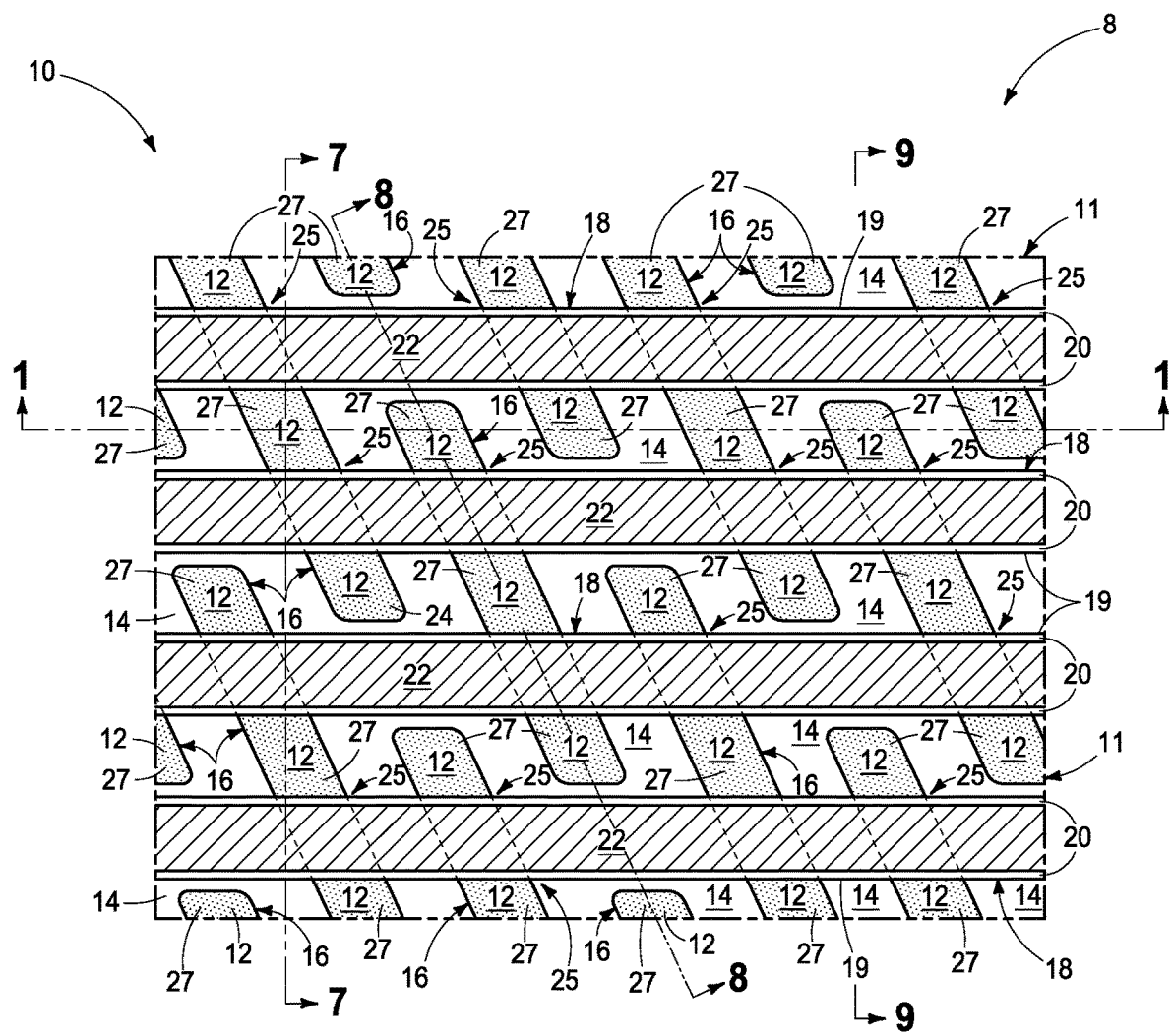
FIG. 3 is a view taken through line 3-3 in FIGS. 1 and 7-9.
Figure 4:
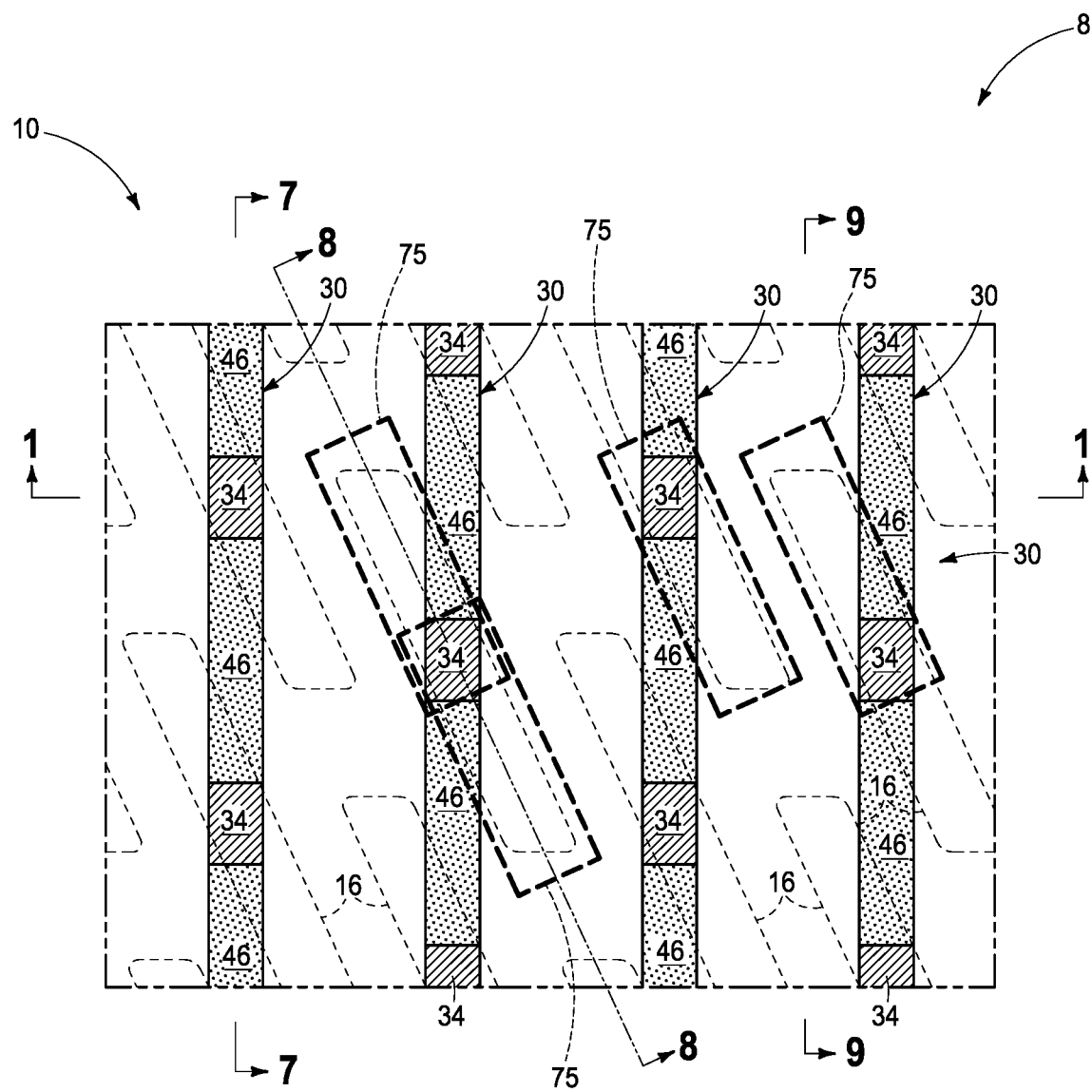
FIG. 4 is a view taken through line 4-4 in FIGS. 1 and 7-9.
Figure 5:
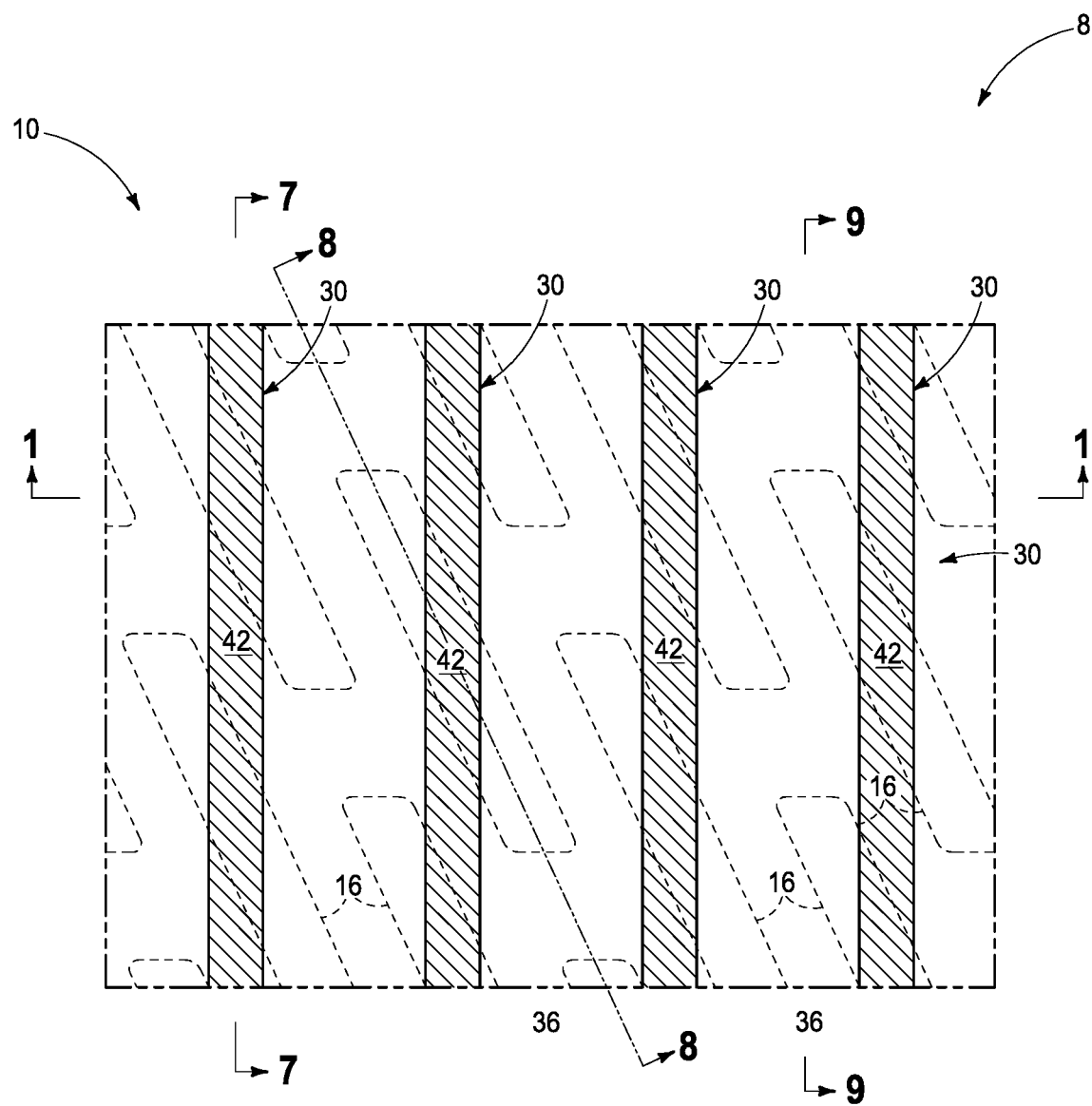
FIG. 5 is a view taken through line 5-5 in FIGS. 1 and 7-9.
Figure 6:
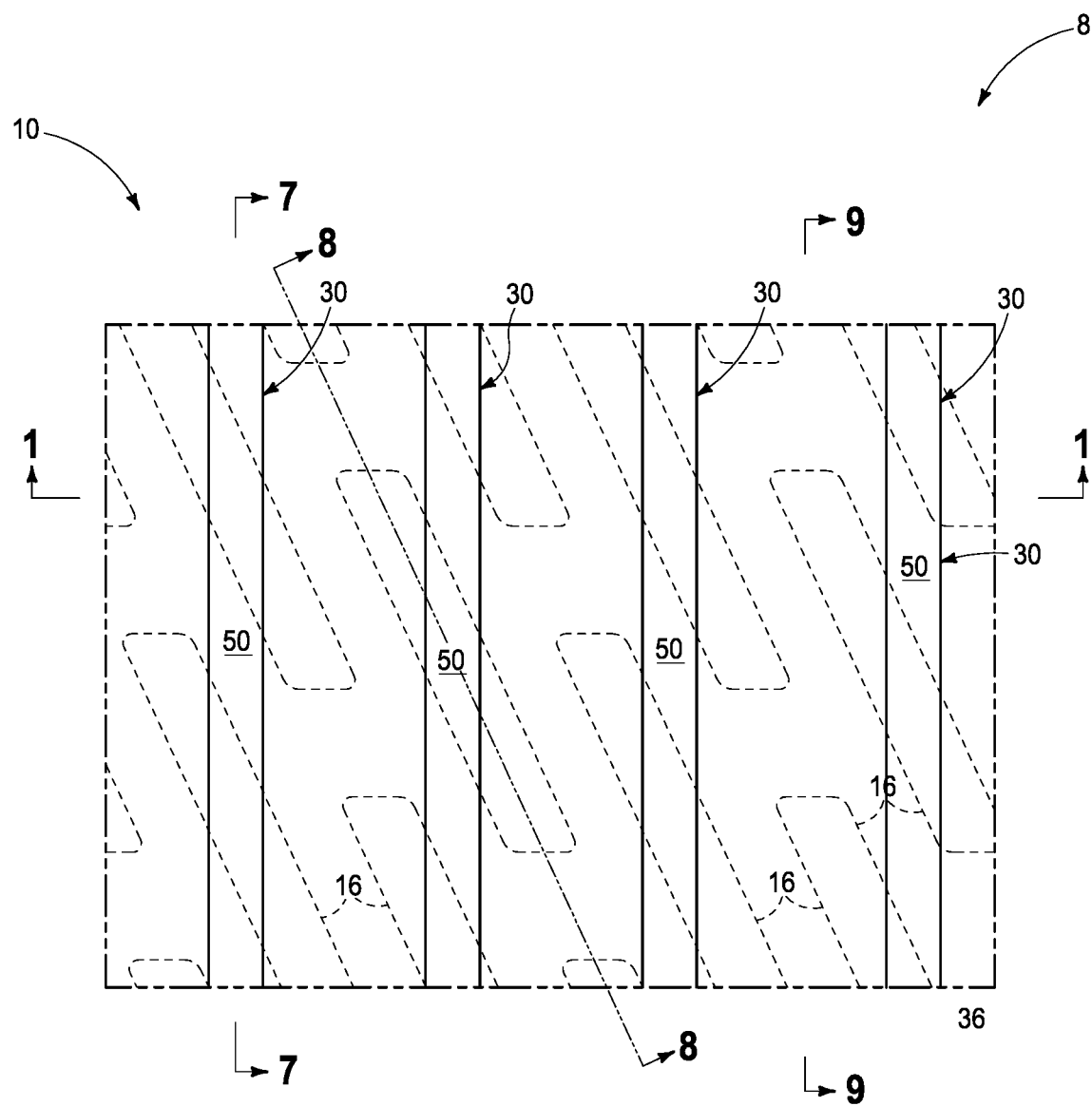
FIG. 6 is a view taken through line 6-6 in FIGS. 1 and 7-9.
Figure 7:
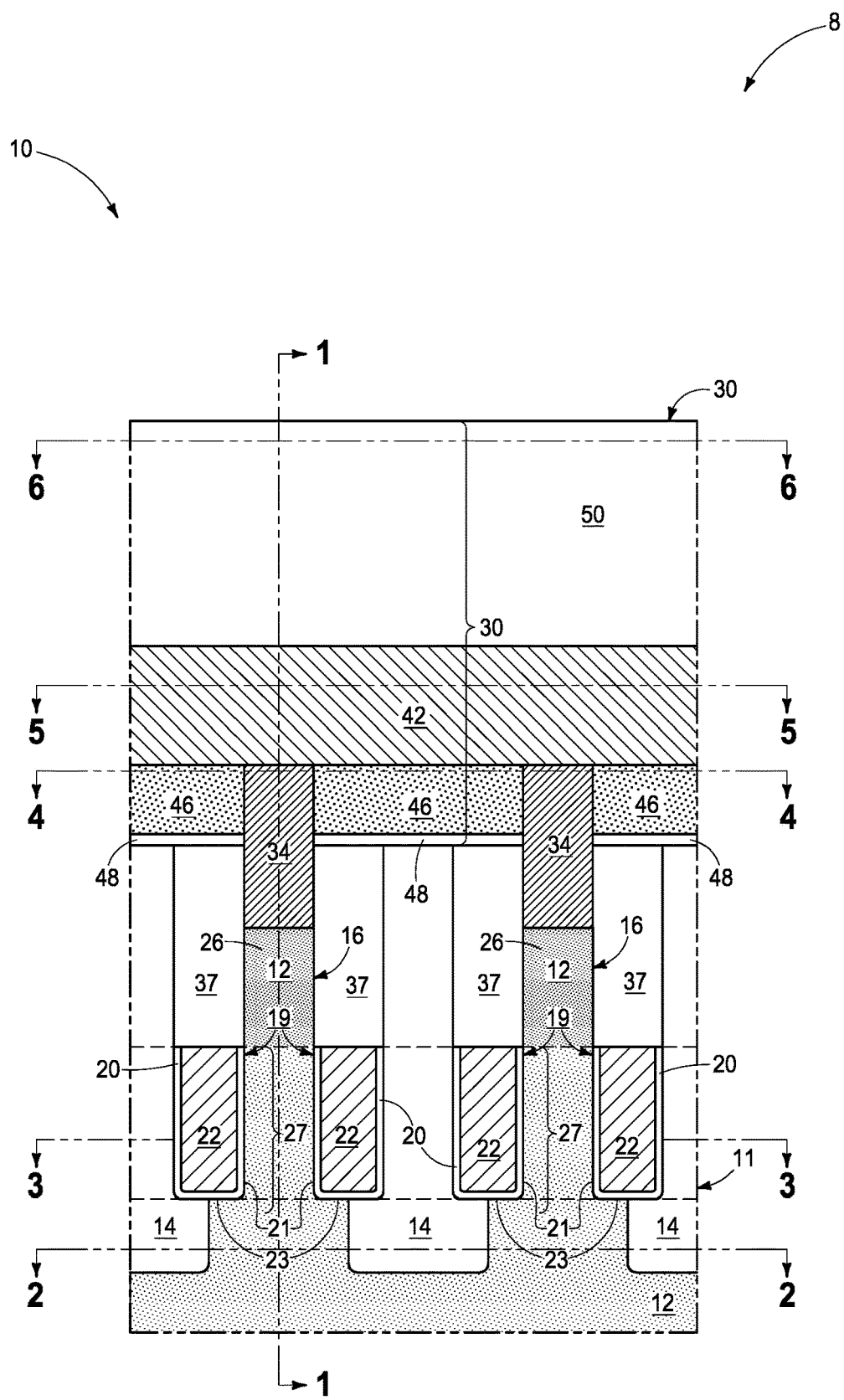
FIG. 7 is a view taken through line 7-7 in FIGS. 1-6.

Embodiments of the invention encompass a construction of integrated circuitry, DRAM circuitry, a method of forming a conductive line construction, a method of forming memory circuitry, and a method of forming DRAM circuitry. Example embodiments of a method of forming DRAM circuitry are described initially with reference to FIGS. 1-34.

Referring to FIGS. 1-9, such show an example fragment of a substrate construction 8 comprising an array or array area 10 that has been fabricated relative to a base substrate 11. Substrate construction 11 may comprise any one or more of conductive/conductor/conducting (i.e., electrically herein), semiconductive/semiconductor/semiconducting, and insulative/insulator/insulating (i.e., electrically herein)

materials. Various materials are above base substrate 11. Materials may be aside, elevationally inward, or elevationally outward the FIGS. 1-9-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 8 and only four outlines 75 shown in FIG. 4, for clarity in such figures), for example DRAM memory cells, individually comprising a field effect transistor device 25 (FIGS. 3 and 8) and a storage element (described below). However, embodiments of the invention encompass fabricating of other memory cells and other constructions of integrated circuitry independent of whether containing memory cells.

Example transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

An example channel region 27 (FIGS. 1, 3, and 7-9) is in semiconductive material 12 below pair of source/drain regions 24, 26 along trench sidewalls 21 (FIGS. 7-9) and around trench base 23. Channel region 27 may be undoped or may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

In one embodiment, digitline structures 30 have been formed and that individually directly electrically couple to the one shared source/drain region 26 of multiple of the individual pairs of devices 25. Digitline structures 30 comprise conductive material 42. Elevationally-extending conductive vias 34 are spaced longitudinally along digitline structures 30 and extend downwardly from conductive material 42. Conductive vias 34 individually directly electrically couple digitline structures 30 to individual of shared source/drain regions 26 of the individual pairs of devices 25. Doped or undoped semiconductor material 46 is between immediately-longitudinally-adjacent conductive vias 34. Lower insulative material 48 (e.g., one or more of silicon dioxide, silicon nitride, aluminum dioxide, hafnium oxide, etc.; e.g., thickness of 50 to 200 Angstroms) is below semiconductor material 46 between immediately-longitudinally-adjacent conductive vias 34. As alternate examples, material 46 may comprise insulative material or metal material or be eliminated, with conductive material 42 extending inwardly to lower insulative material 48 (not shown). Example digitline structures 30 comprise an insulator-material cap 50 (e.g., silicon nitride).

Figure 8:
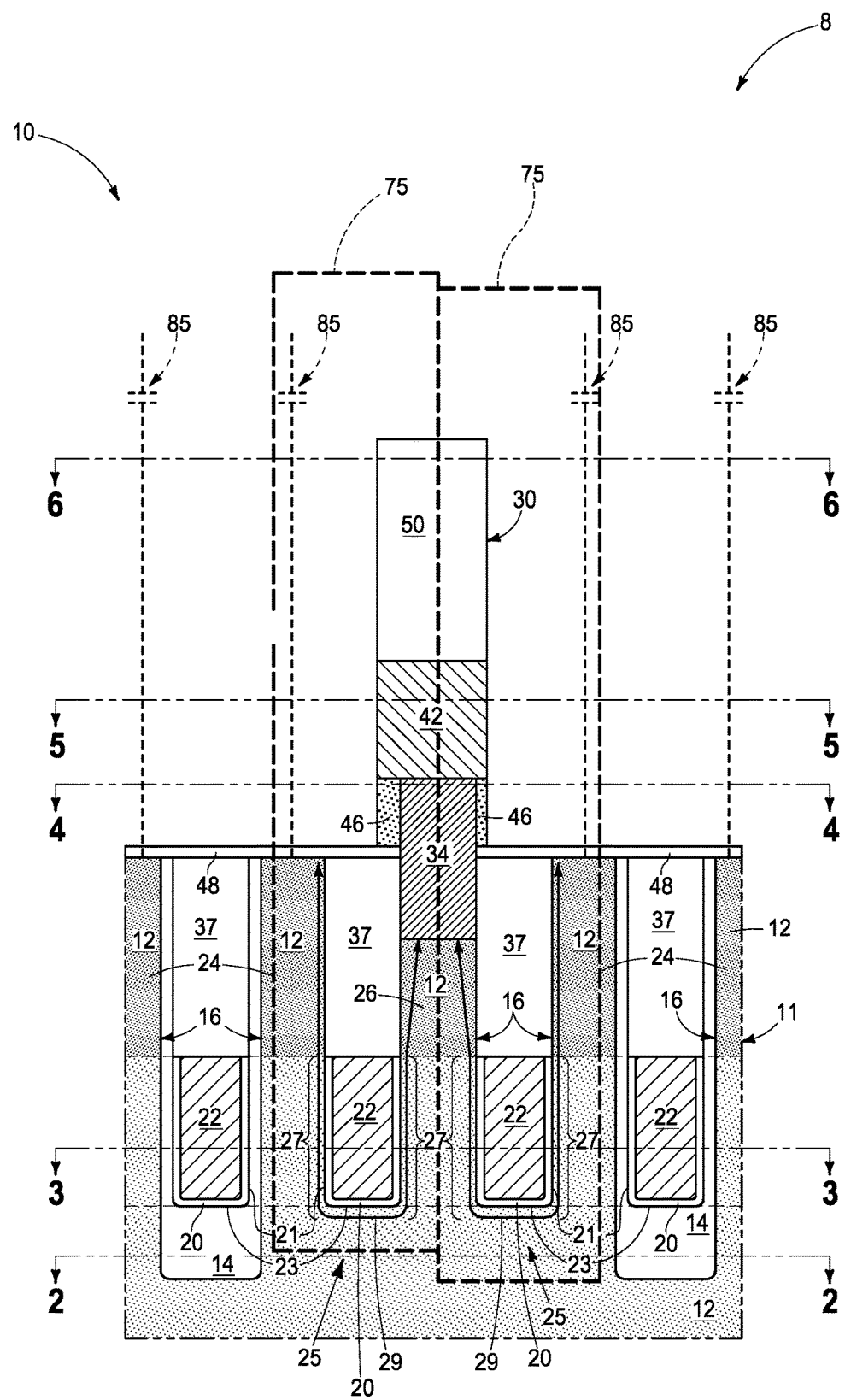
FIG. 8 is a view taken through line 8-8 in FIGS. 2-6.
Figure 9:
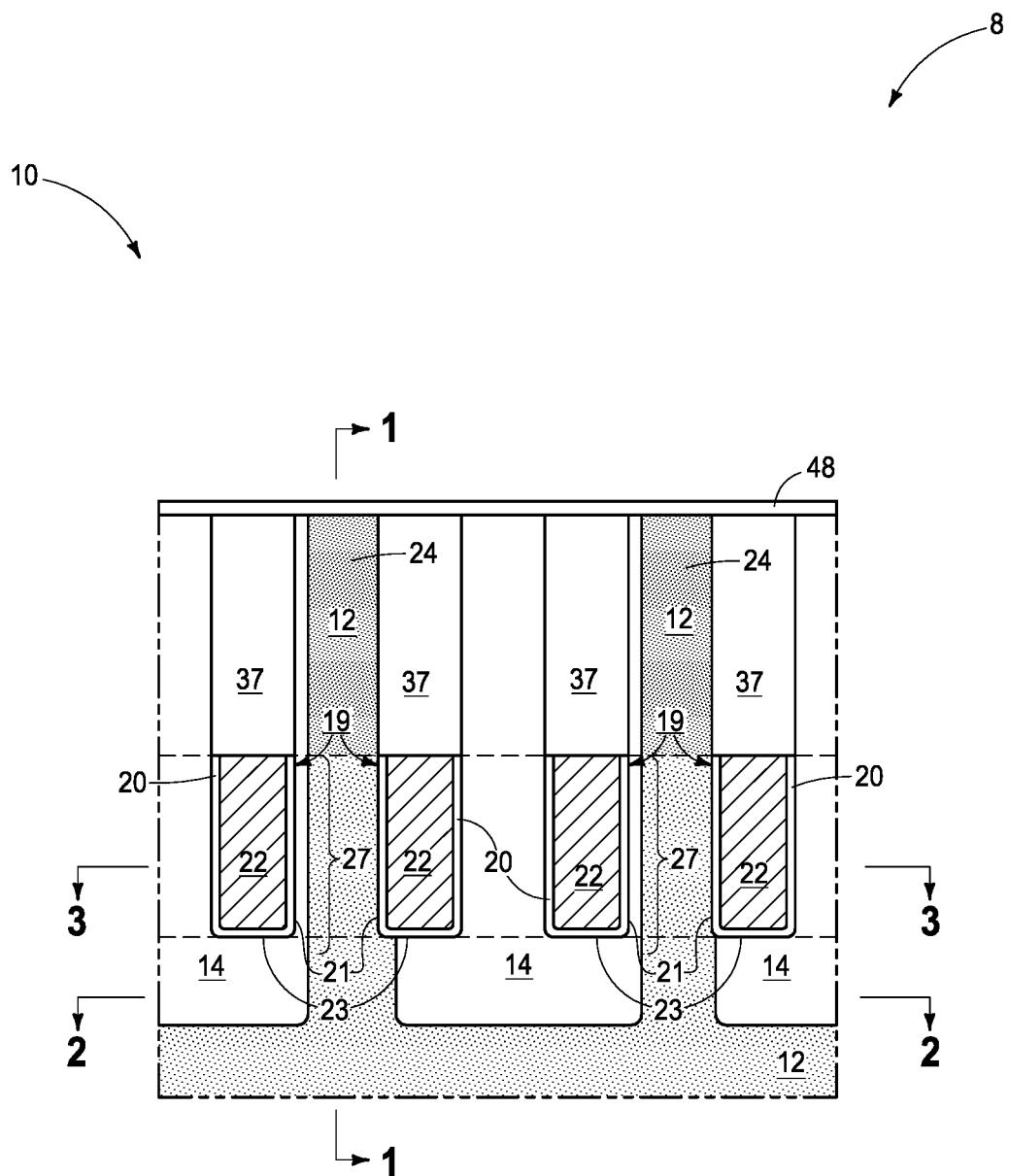
FIG. 9 is a view taken through line 9-9 in FIGS. 2-6.

A pair of storage elements (e.g., charge-storage devices such as capacitors 85 shown as dashed lines in FIG. 8, but not yet fabricated) will individually directly electrically couple to one of the other source/drain regions 24 in the individual pairs of devices 25.

Figure 10:
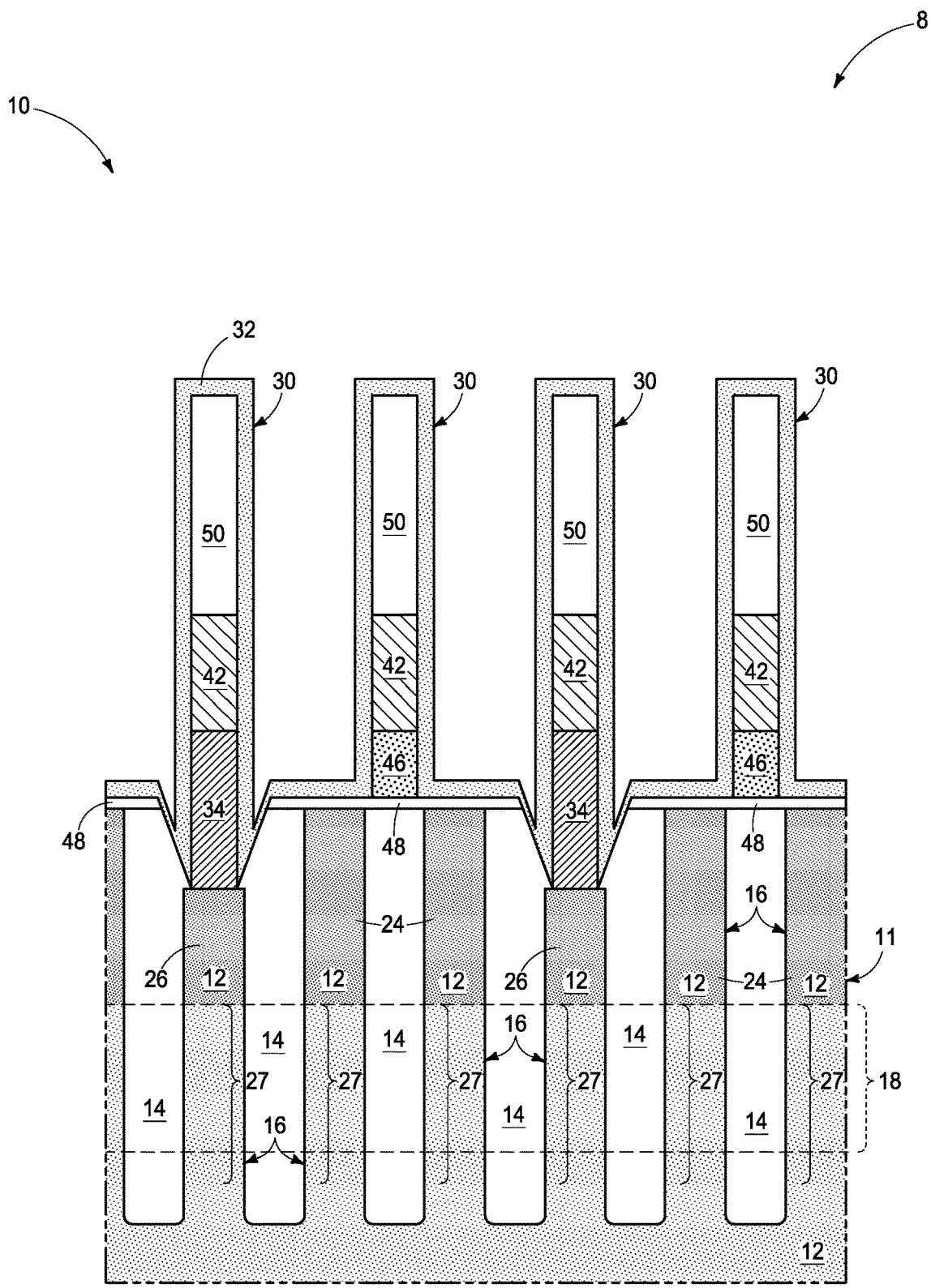
FIGS. 10-38 are diagrammatic sequential top and/or sectional views of the construction of FIGS. 1-9 in process in accordance with some embodiments of the invention.

Referring to FIG. 10, a first layer of insulator material 32 (e.g., silicon nitride) has been formed along and directly above conductive material 42 of digitline structure 30 and thereby comprises a part of digitline structure 30.

Figure 11:
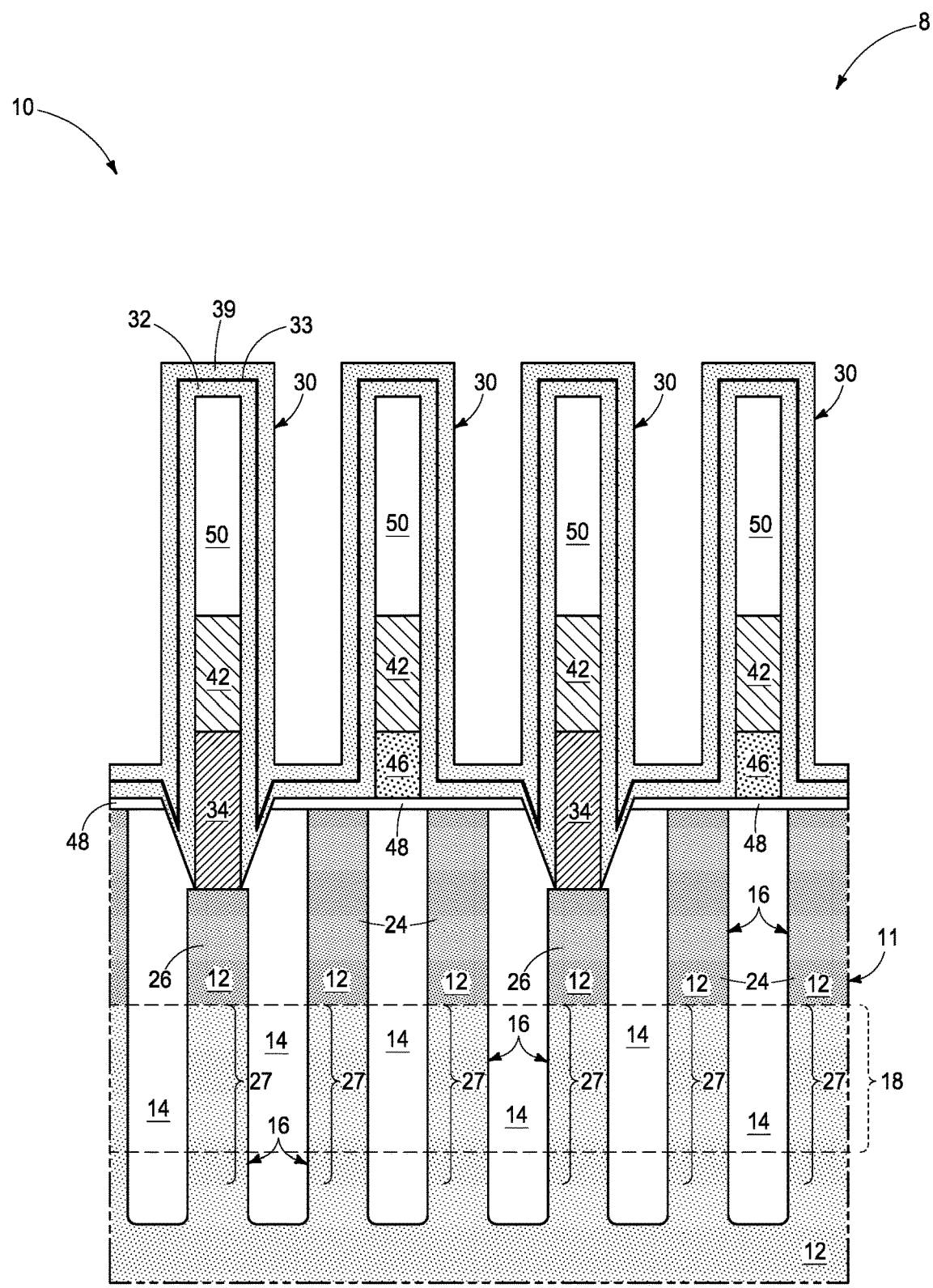

Referring to FIG. 11, an etch-stop layer 33 (e.g., shown by a thick, dark line; e.g., silicon dioxide) has been formed directly above first layer of insulator material 32, and is of different composition from that of first layer of insulator material 32. A second layer of insulator material 39 (e.g., silicon nitride) has been formed directly above etch-stop layer 33.

Figure 12:
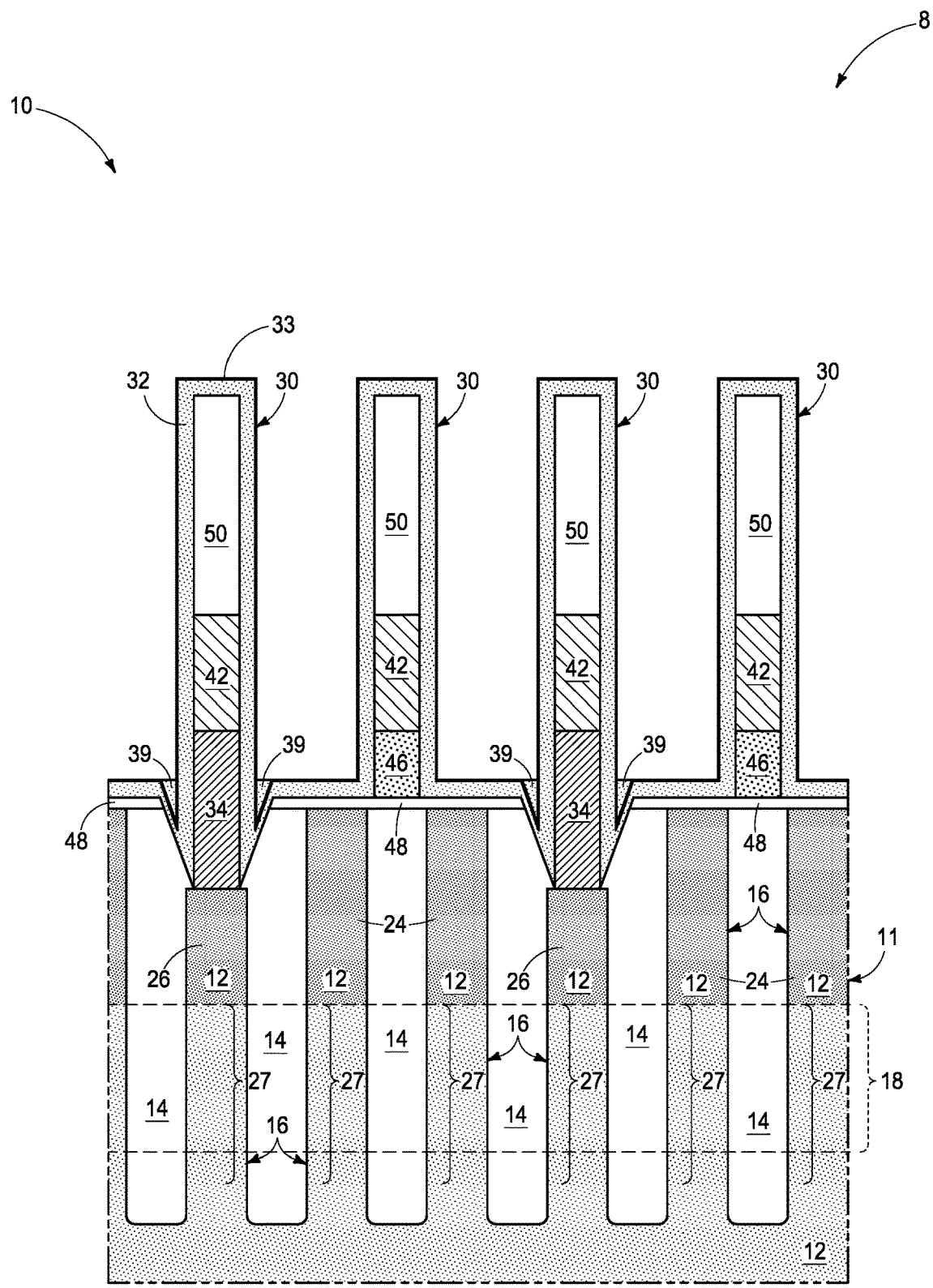
Figure 13:
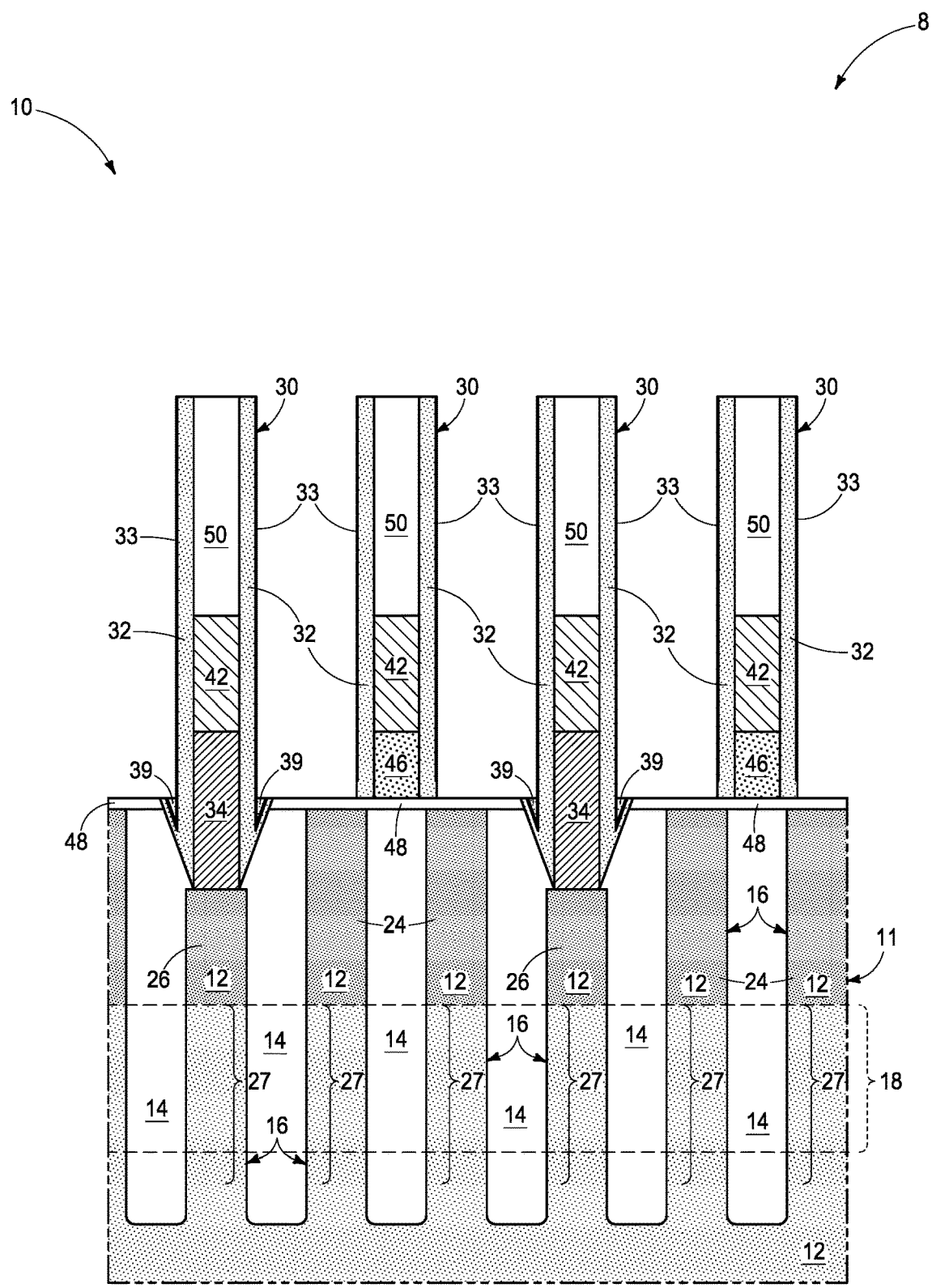

Referring to FIG. 12, second layer of insulator material 39 has been etched selectively relative to etch-stop layer 33 (e.g., by wet etching using phosphoric acid where material 39 comprises silicon nitride and material 33 comprises silicon dioxide). FIG. 13 shows example subsequent processing wherein, for example, dry anisotropic etching has been conducted of etch-stop layer 33 and second layer of insulator material 39 to clear such from being atop lower insulative material 48 and from being atop insulator-material cap 50.

Figure 14:
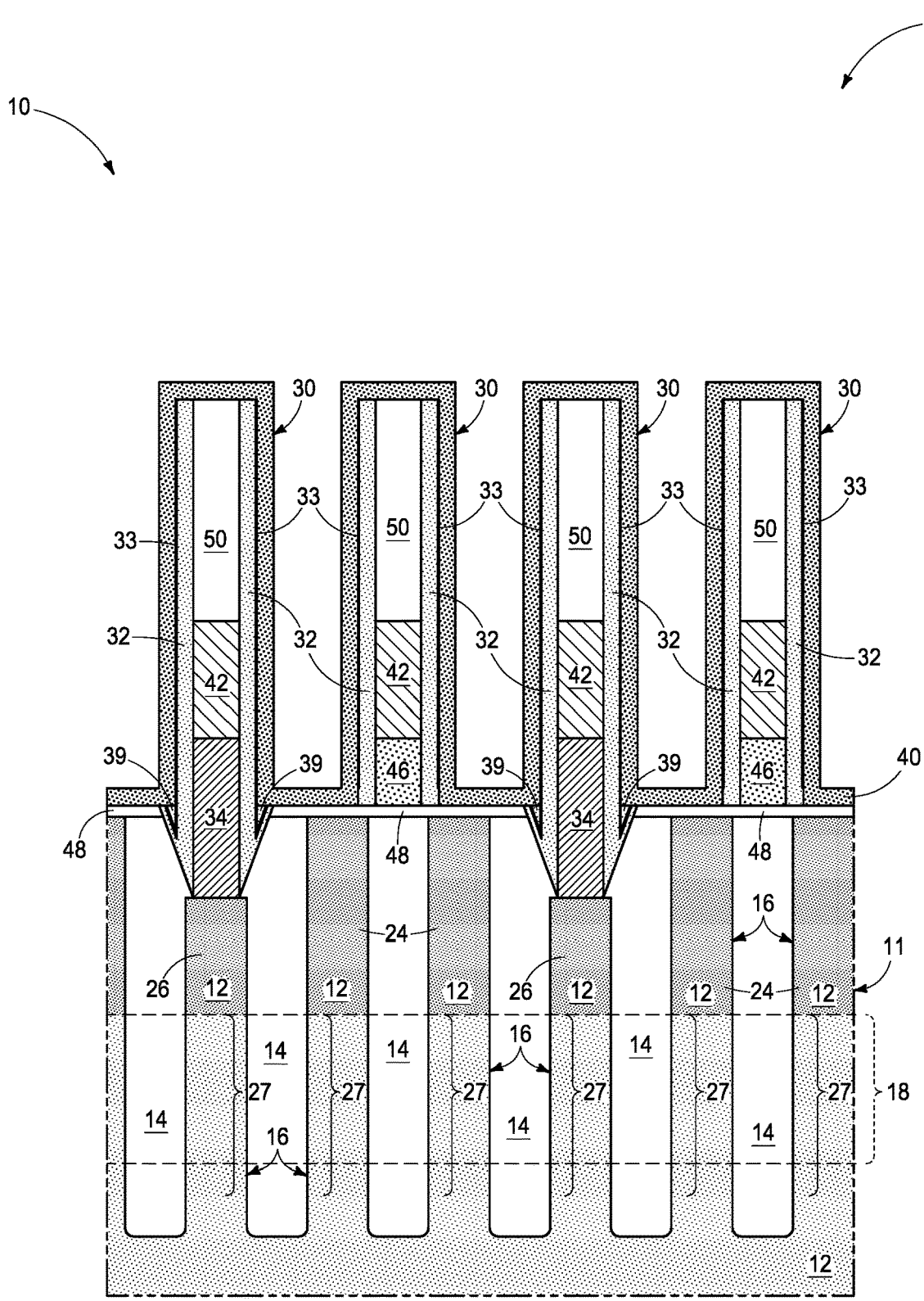
Figure 15:
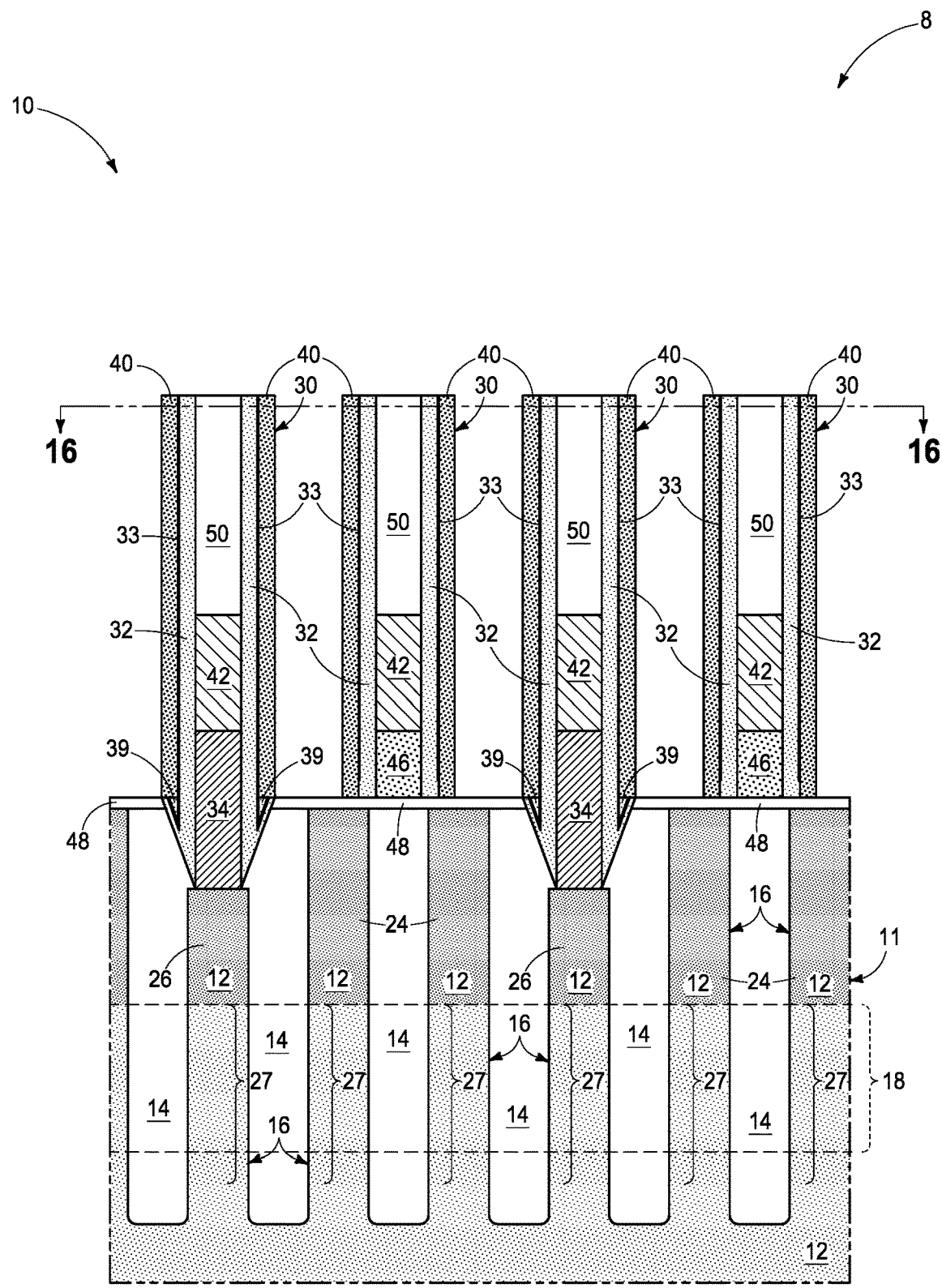
Figure 16:
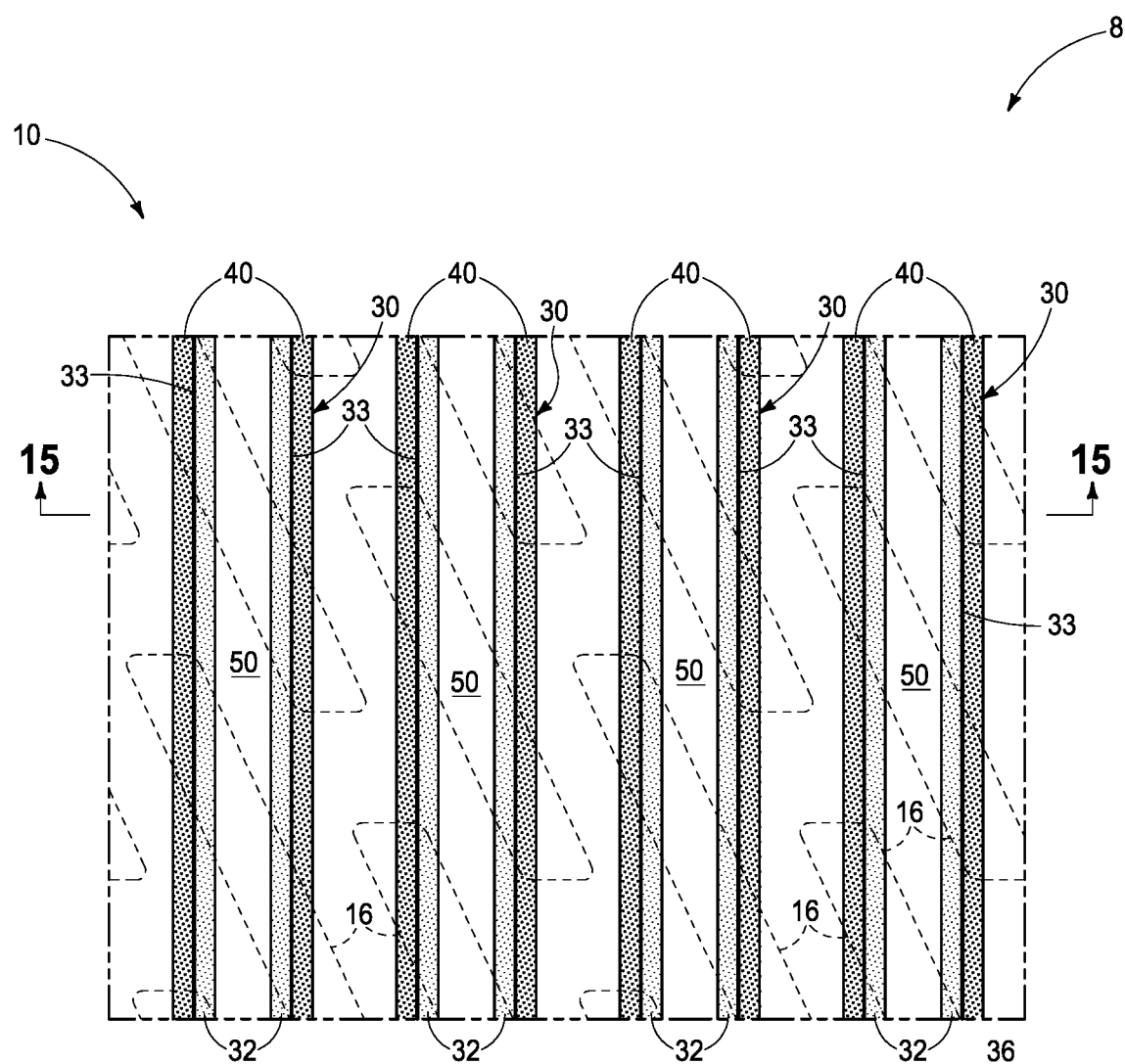

Referring to FIG. 14, sacrificial material 40 (e.g., silicon dioxide) has been formed over first layer of insulator material 32 (and over remaining portions of etch-stop layer 33 if present). In one embodiment, etch-stop layer 33 and sacrificial material 40 are of the same composition. FIGS. 15 and 16 show example subsequent processing wherein dry anisotropic etching has been conducted to remove sacrificial material 40 from being over lower insulative material 48 and from being over insulative-material caps 50.

Figure 17:
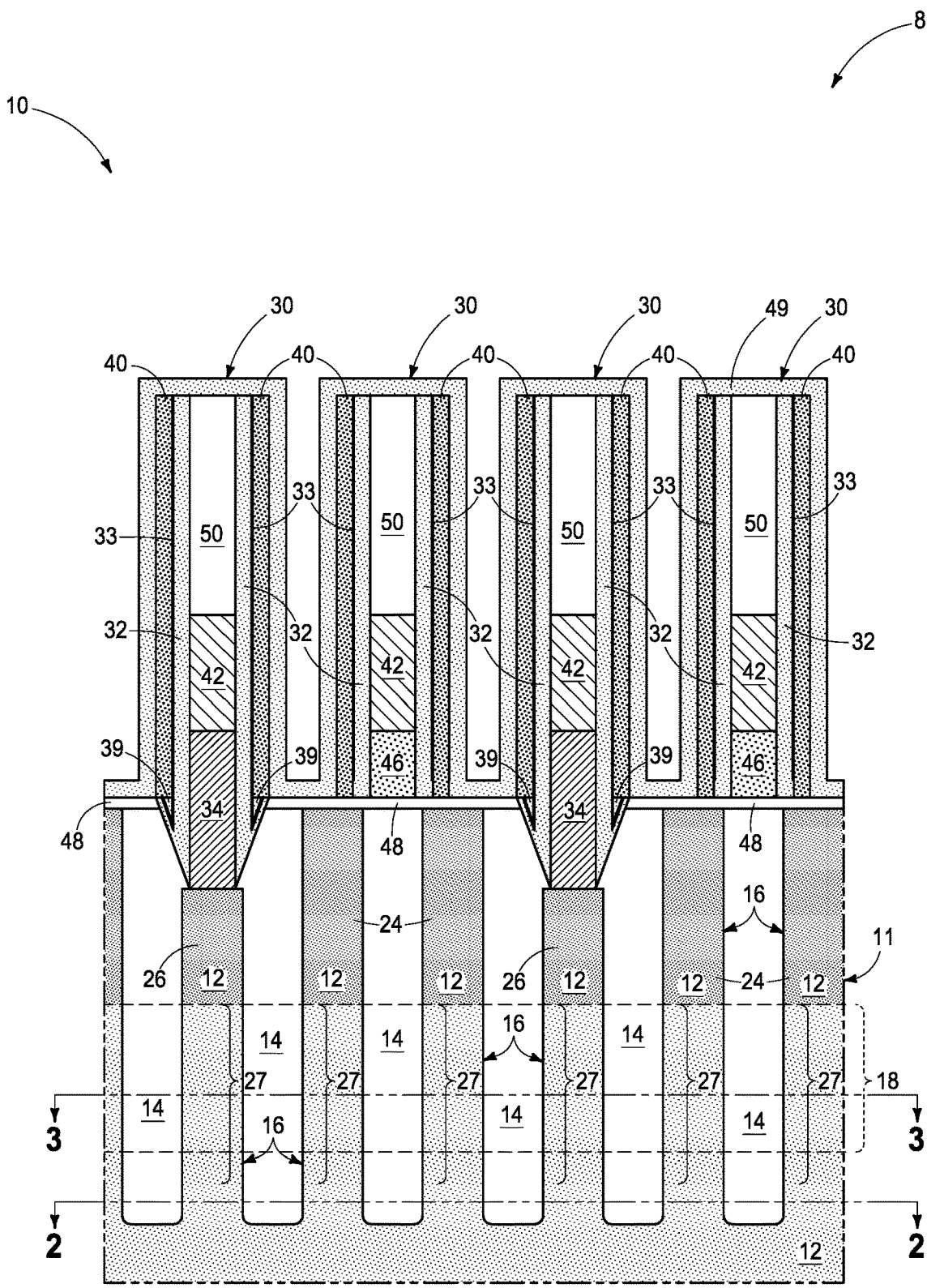
Figure 18:
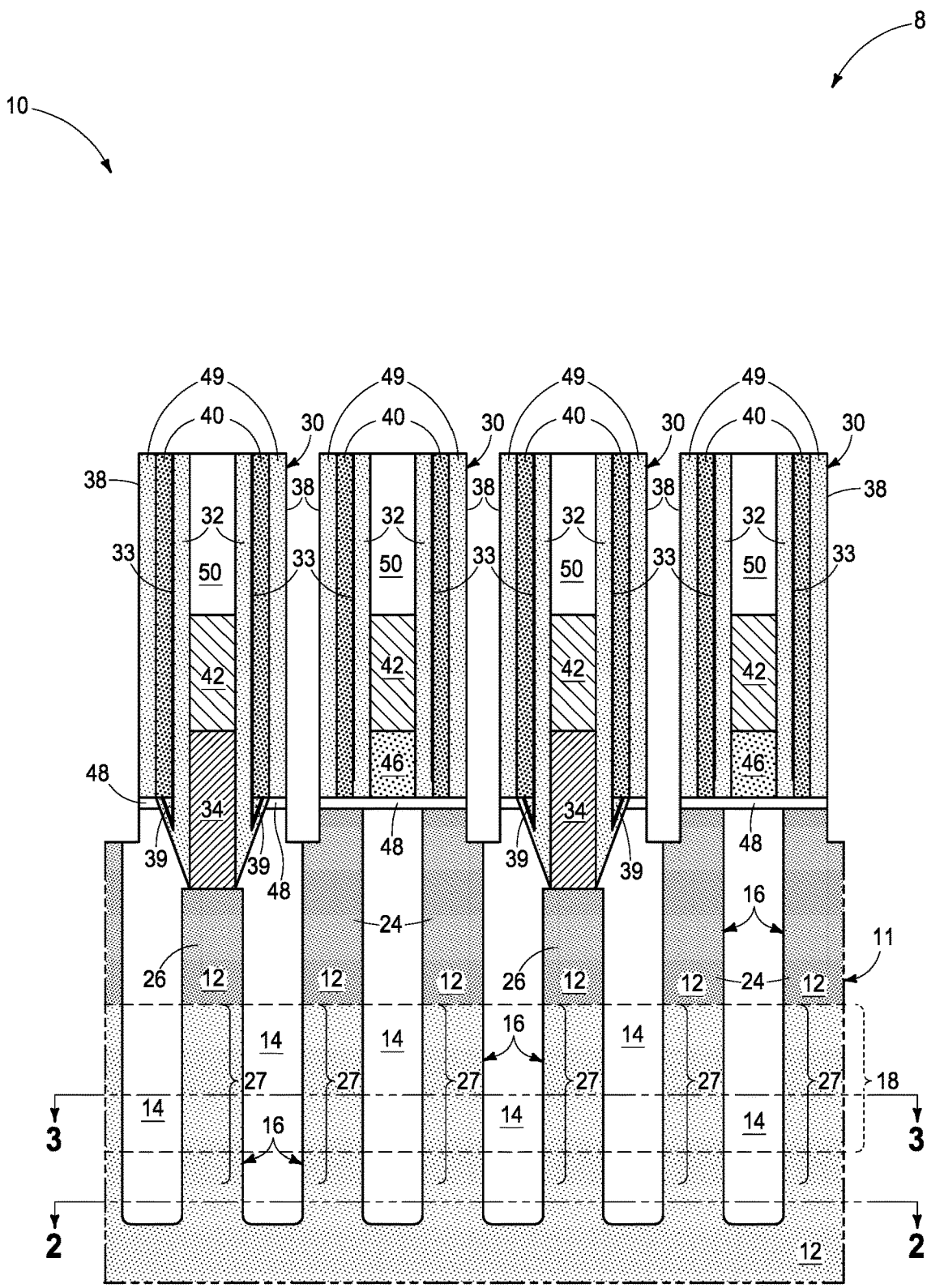

Referring to FIG. 17, a third layer of insulator material 49 (e.g., silicon nitride) has been formed over sacrificial material 40. FIG. 18 shows example subsequent processing whereby third layer of insulator material 49 has been anisotropically etched back to removed from being over lower insulative material 48 at least to non-shared source/drain regions 24, with some over-etch into underlying substrate material/regions 12/24/14 being shown. In one embodiment, the first, second, and third layers of insulator material 32, 39, 49, respectively, are all of the same composition relative one another.

The above-described processing is but one example of forming a digitline structure 30 comprising opposing longitudinal sides 38 individually comprising a sacrificial material 40 that is laterally between insulator material 32 and 49. Any other existing or future-developed method may be used. In one embodiment, the insulator material is of the same composition on both sides of the sacrificial material, and in one embodiment the sacrificial material is insulative.

Figure 19:
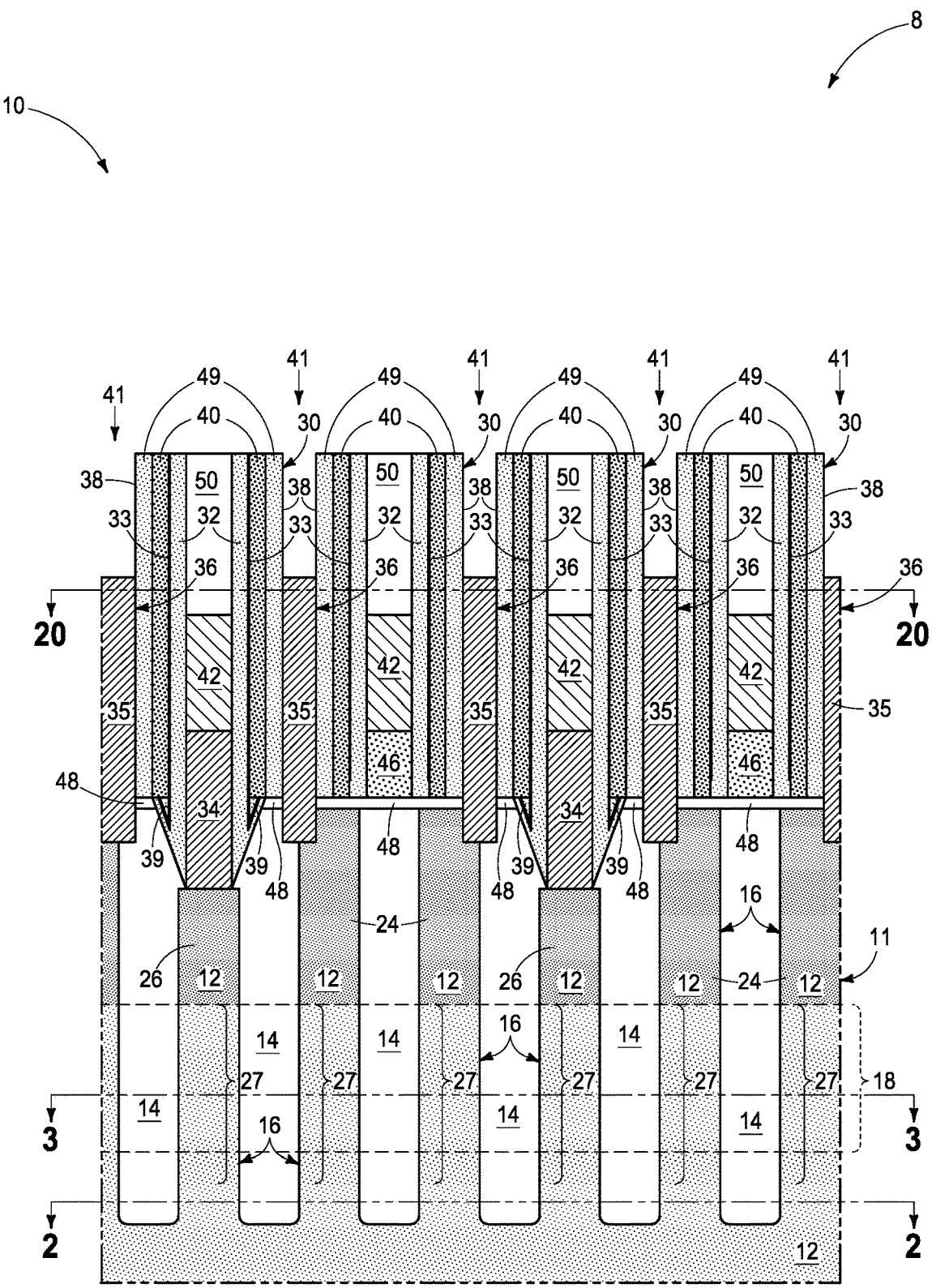
Figure 20:
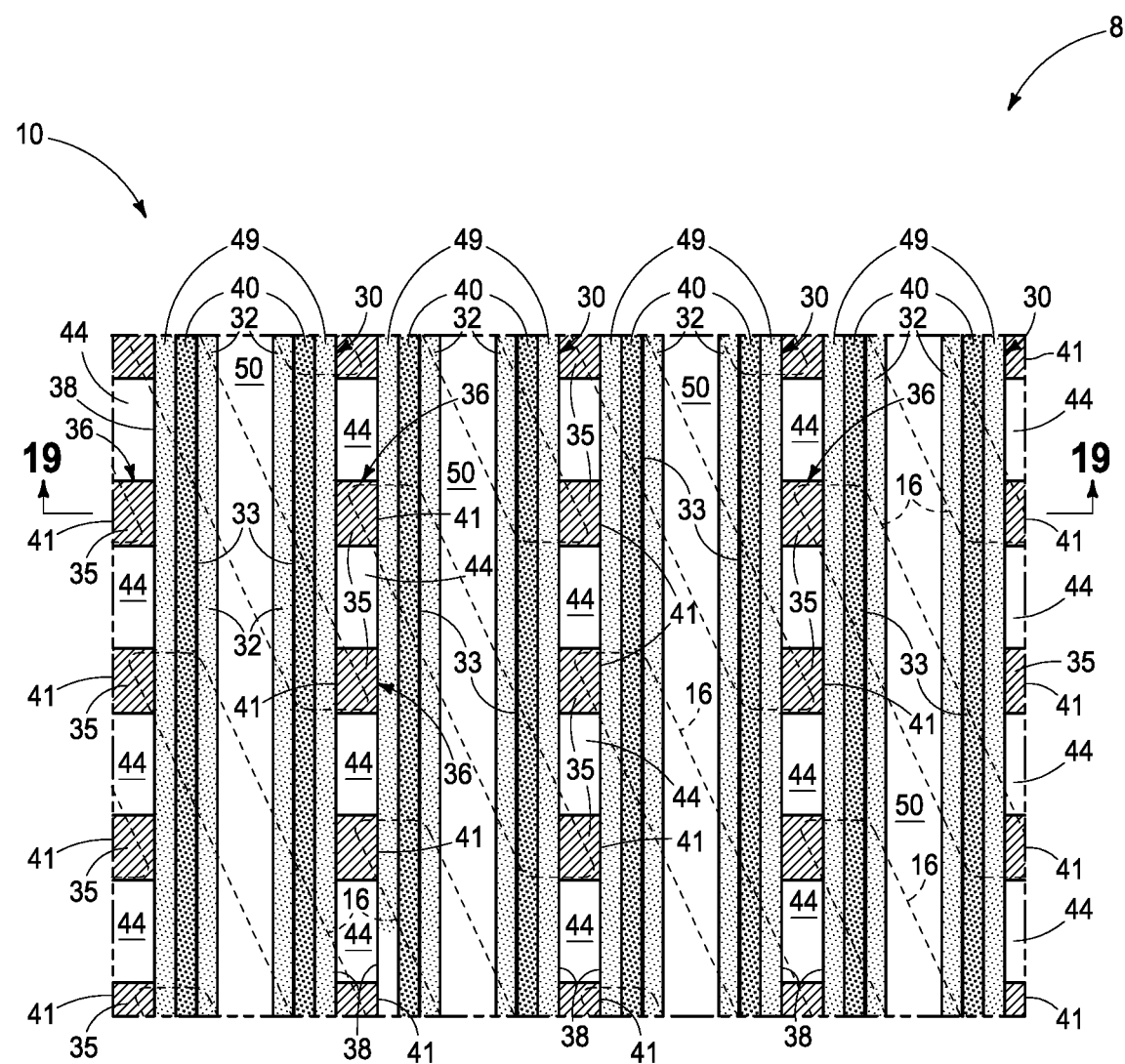

Referring to FIGS. 19 and 20, insulative material 44 (e.g., silicon dioxide and/or silicon nitride) has been formed between digitline structures 30 and subsequently patterned to form contact openings 41 there-through to individual non-shared source/drain regions 24. Conductive material 35 has subsequently been formed in openings 41, and in one embodiment has been etched back as shown, to form conductive vias 36. Such is by way of example but one example method of forming conductive vias 36 laterally between and spaced longitudinally along digitline structures 30 and that individually directly electrically couple to one of the other of source/drain regions 24 in the individual pairs of transistors. Any other existing or future-developed method may be used.

Figure 21:
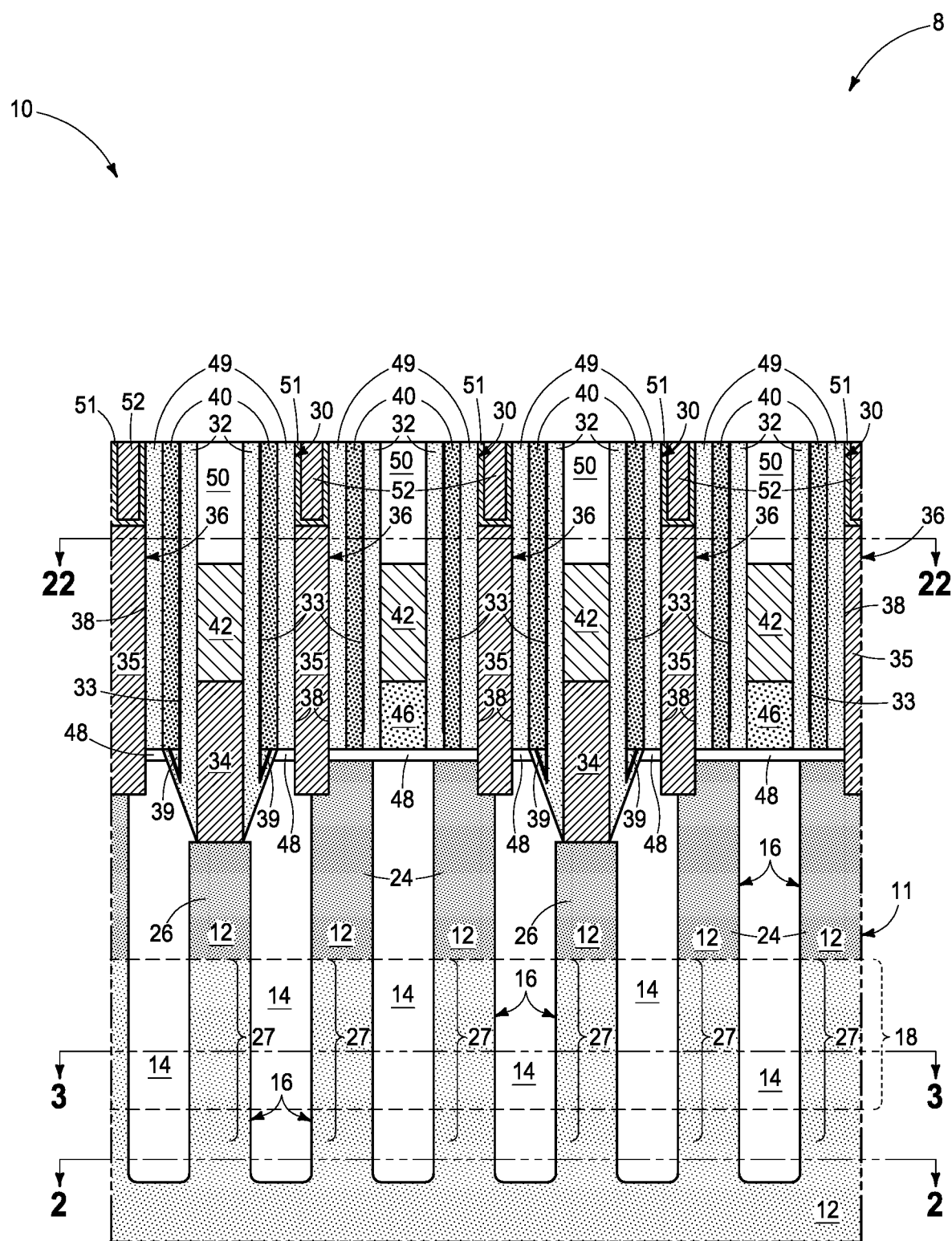
Figure 22:
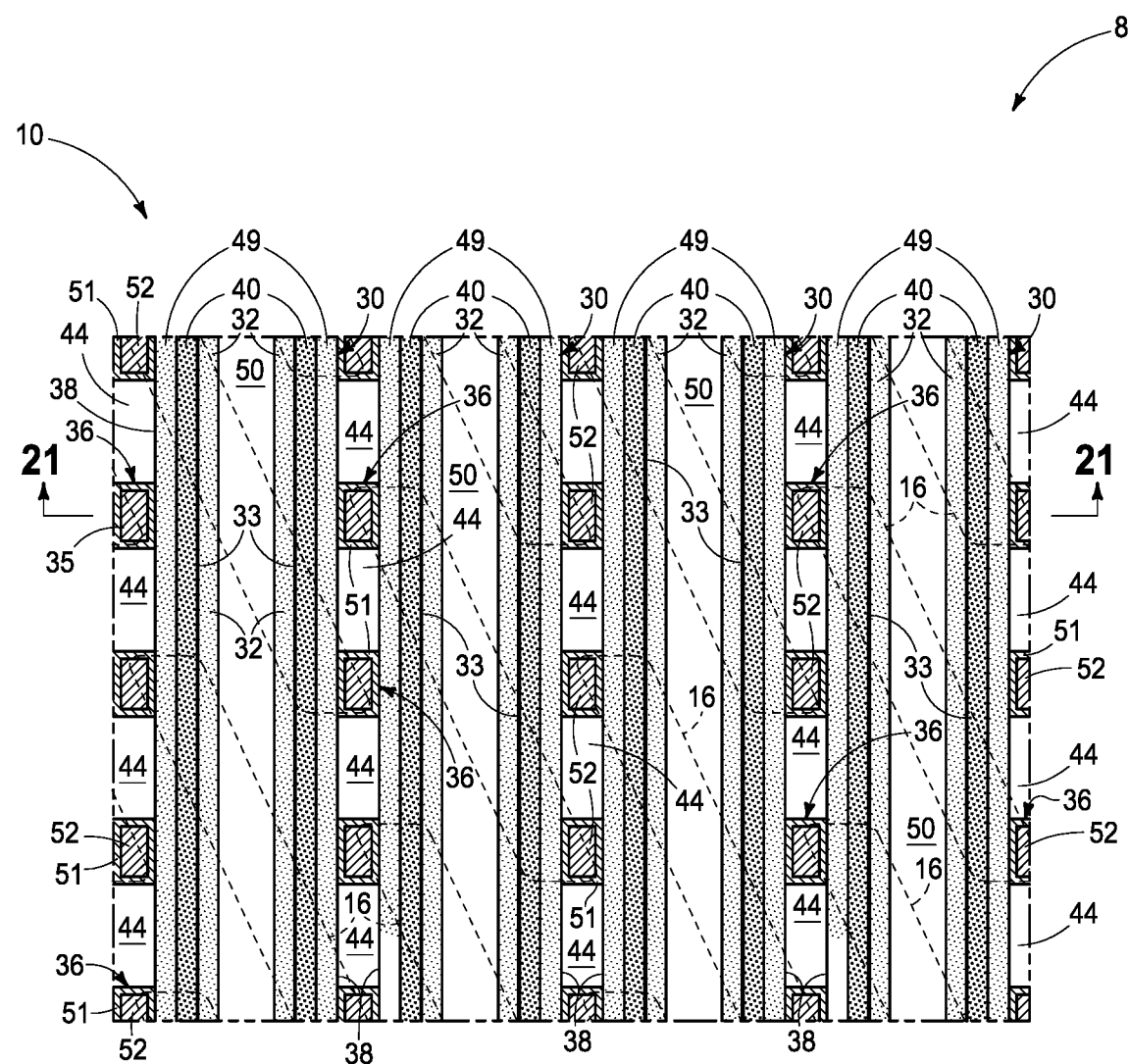

Referring to FIGS. 21 and 22, conductive materials 51 and 52 (e.g., elemental titanium and elemental tungsten, respectively) have been formed atop conductive material 35 to comprise part of individual conductive vias 36.

Figure 23:
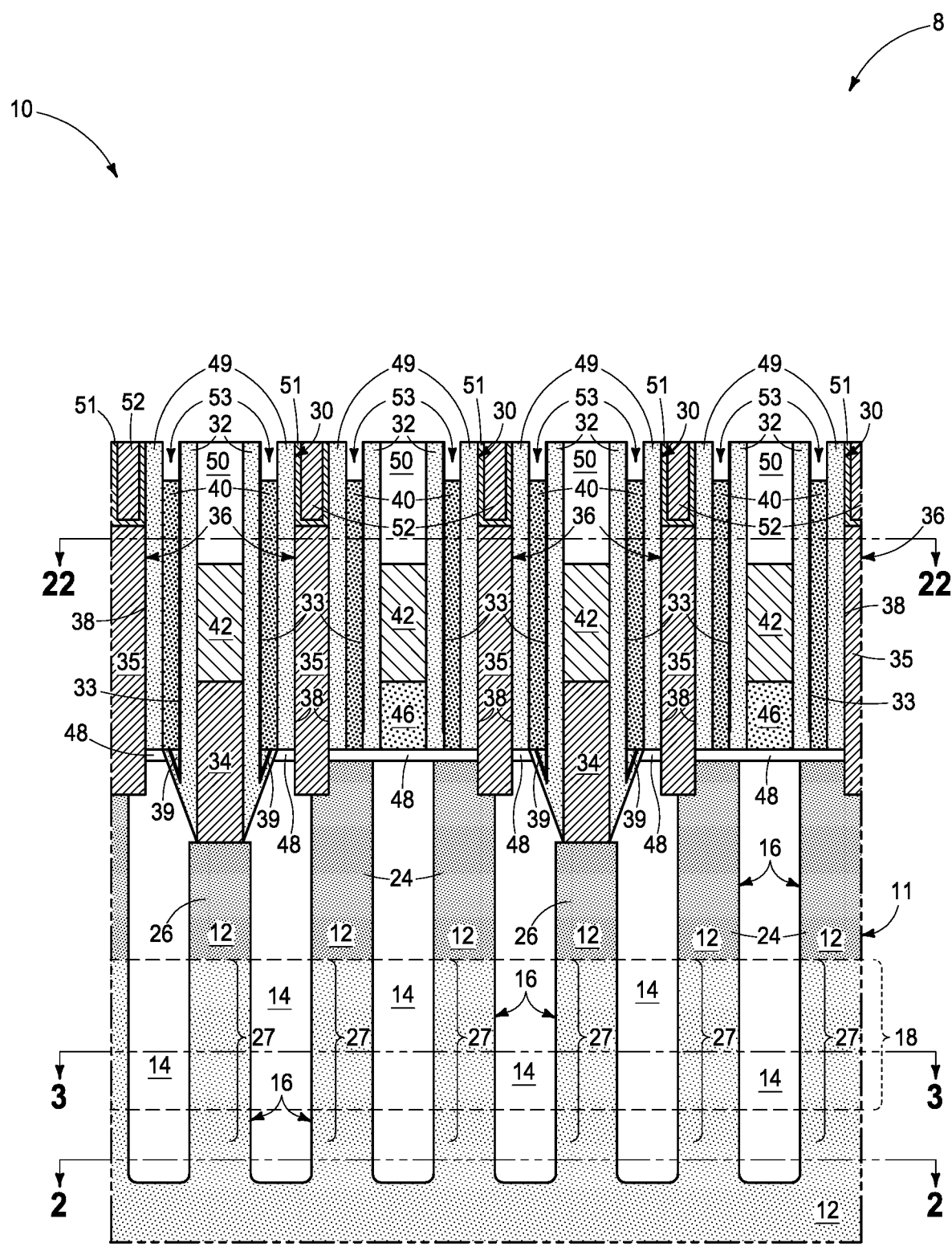

Referring to FIG. 23, some and only some of sacrificial material 40 has been removed (e.g., by etching) to form an upwardly-open cavity 53 laterally between insulator material 32 and 49 on opposing longitudinal sides 38 of individual conductive line structures 30. Cavity 53 is above an unremoved portion of sacrificial material 40 that is therebelow.

Figure 24:
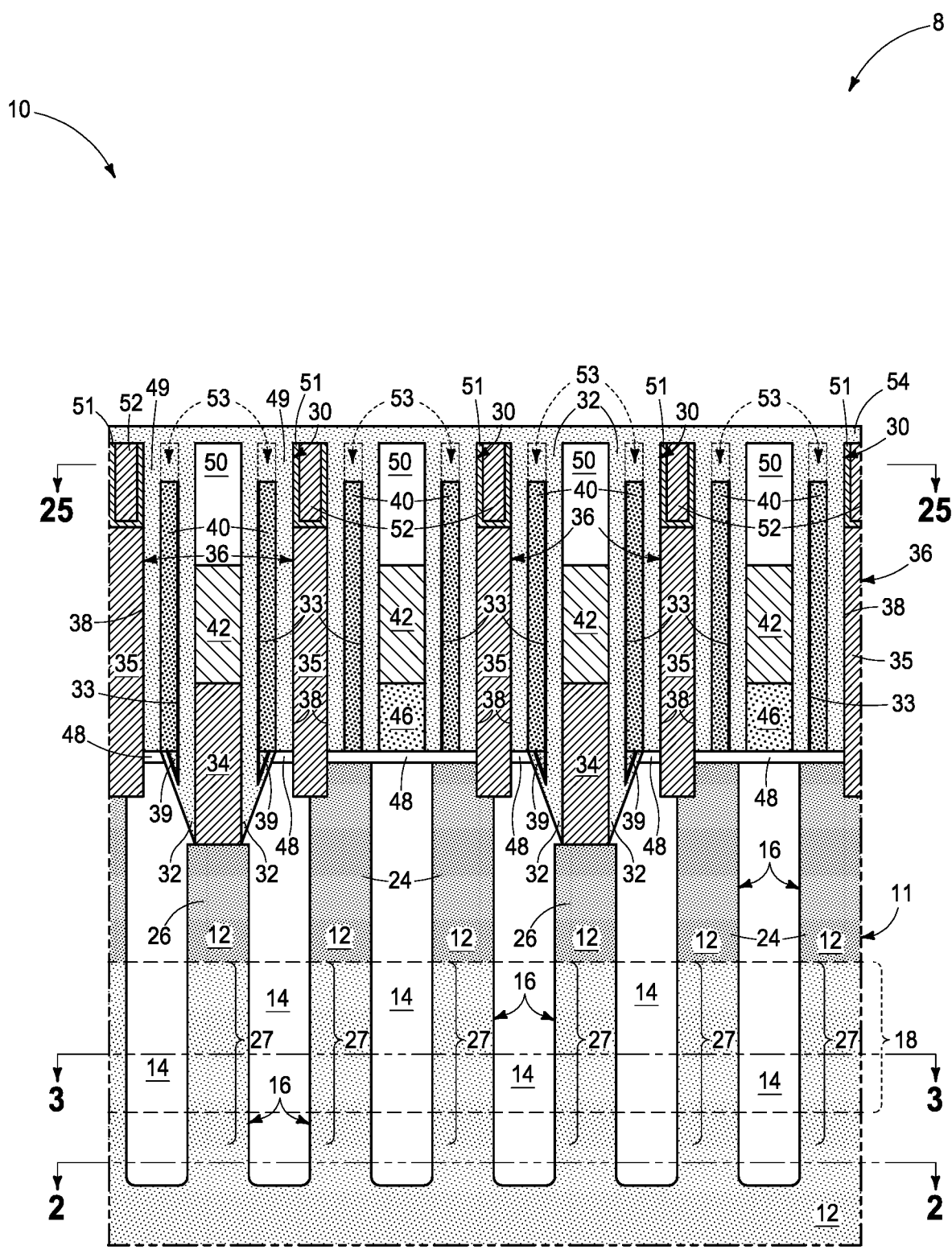
Figure 25:
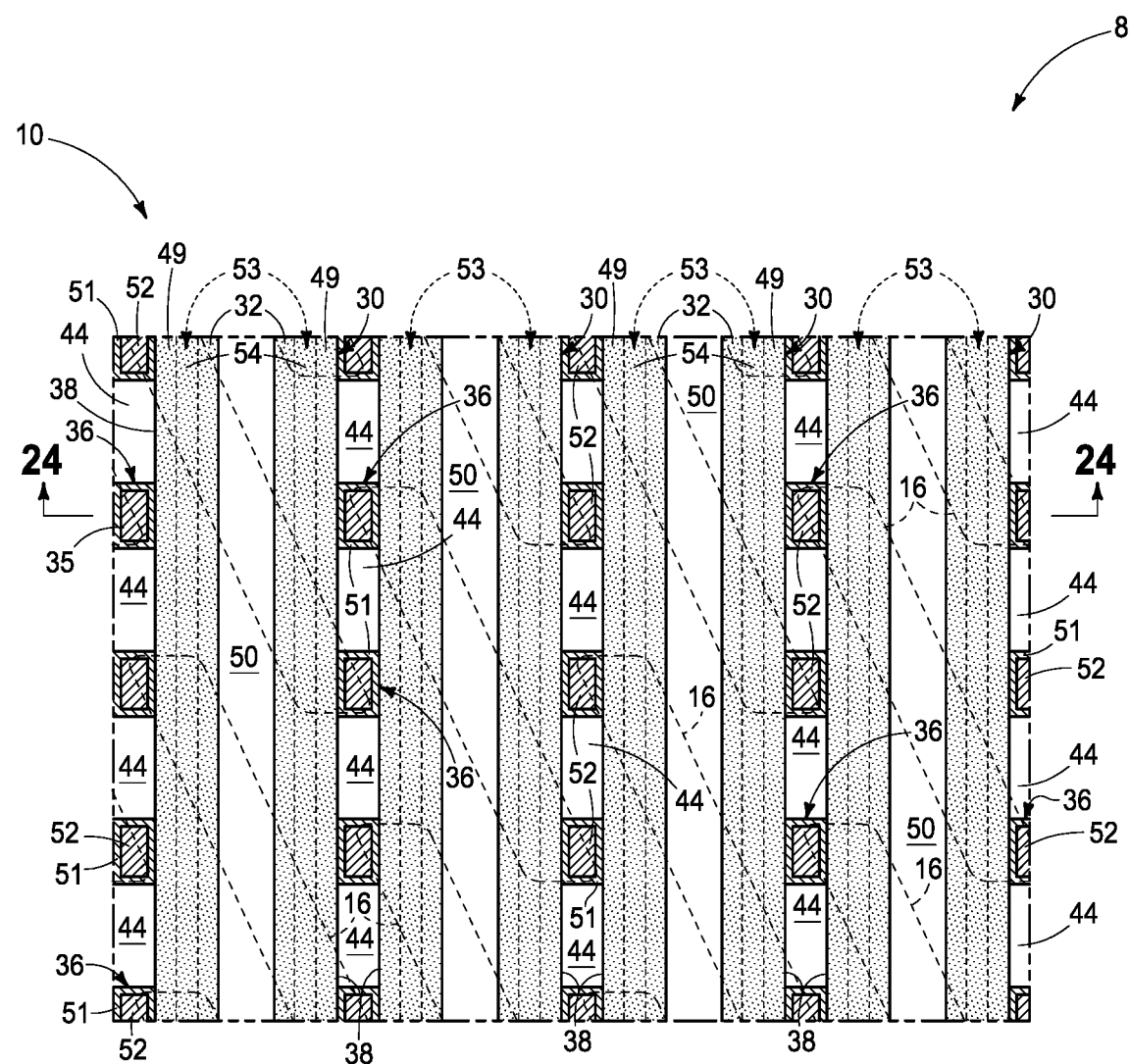
Figure 26:
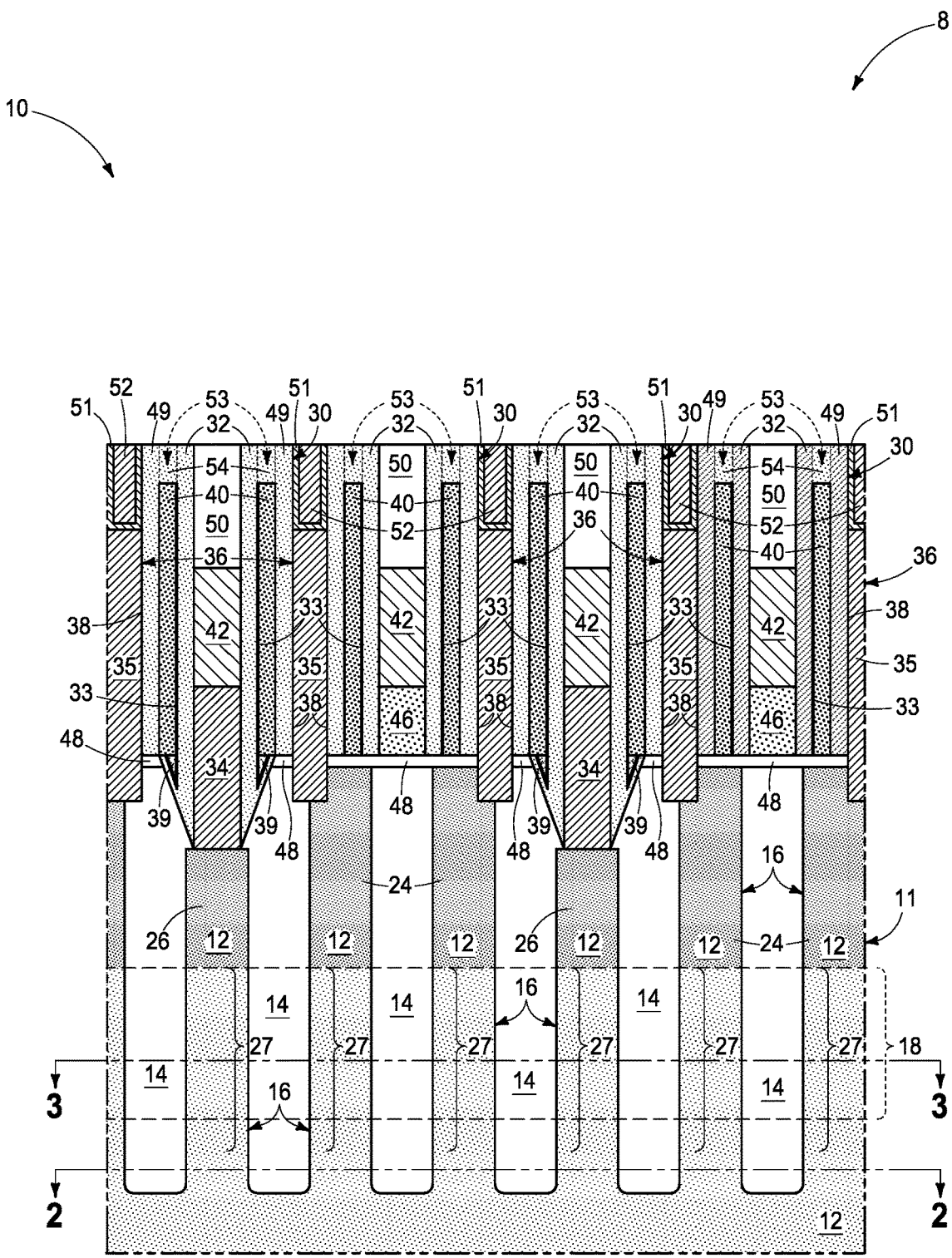

At least an uppermost portion of the cavity, in one embodiment all of the cavity, is filled with fill material. FIGS. 24 and 25 show an example such embodiment wherein a fill material 54 (e.g., silicon nitride) has been deposited to fill, and in one embodiment overfill, all of individual cavities 53 with such fill material 54. In one embodiment, fill material 54 is of different composition from that of sacrificial material 40, and in one such embodiment one of the sacrificial material and the fill material is silicon dioxide and the other of the insulator material and the fill material is silicon nitride. FIG. 26 shows example subsequent processing wherein fill material 54 has been sufficiently removed (e.g., by polishing or etch back) to upwardly expose conductive vias 36.

Figure 27:
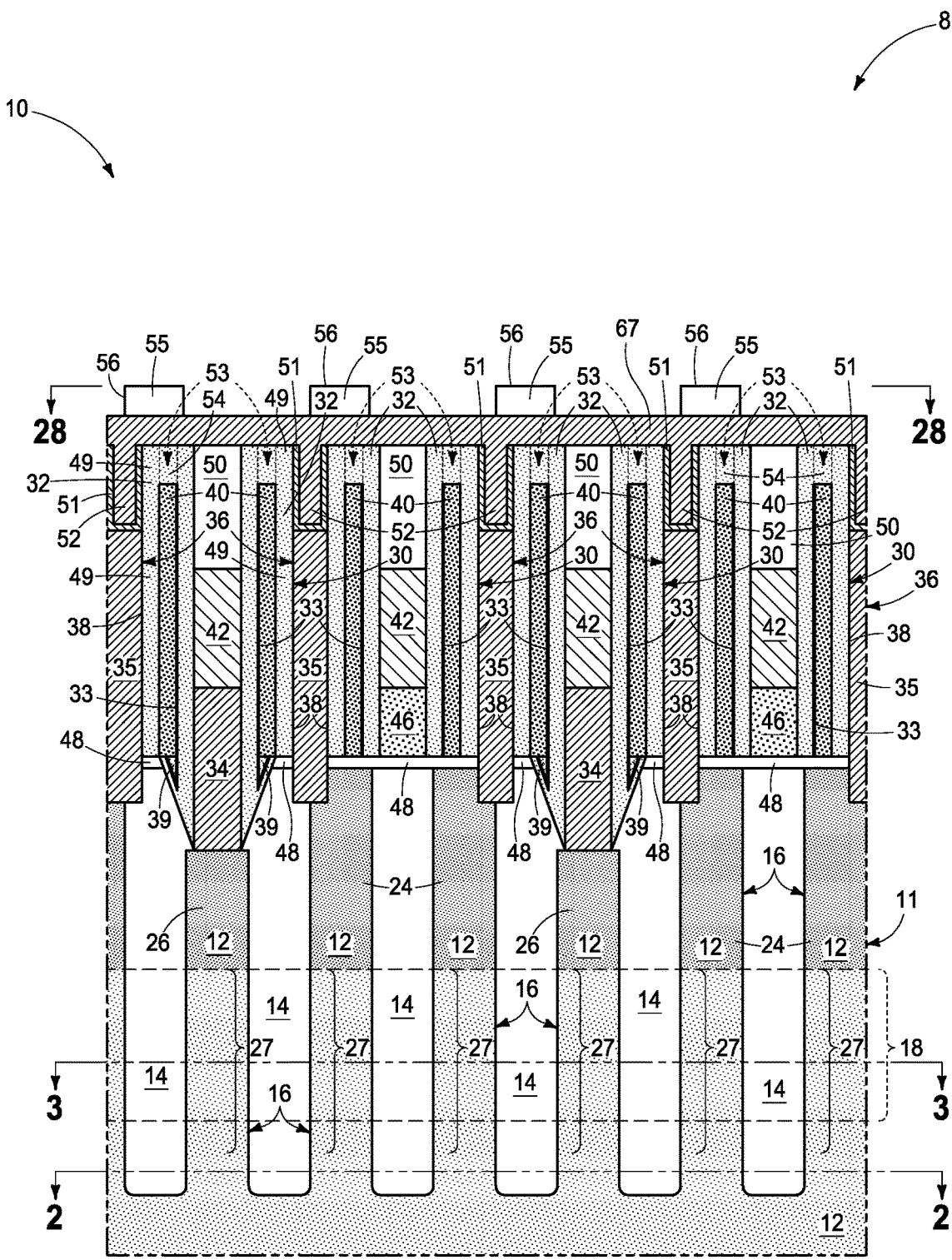
Figure 28:
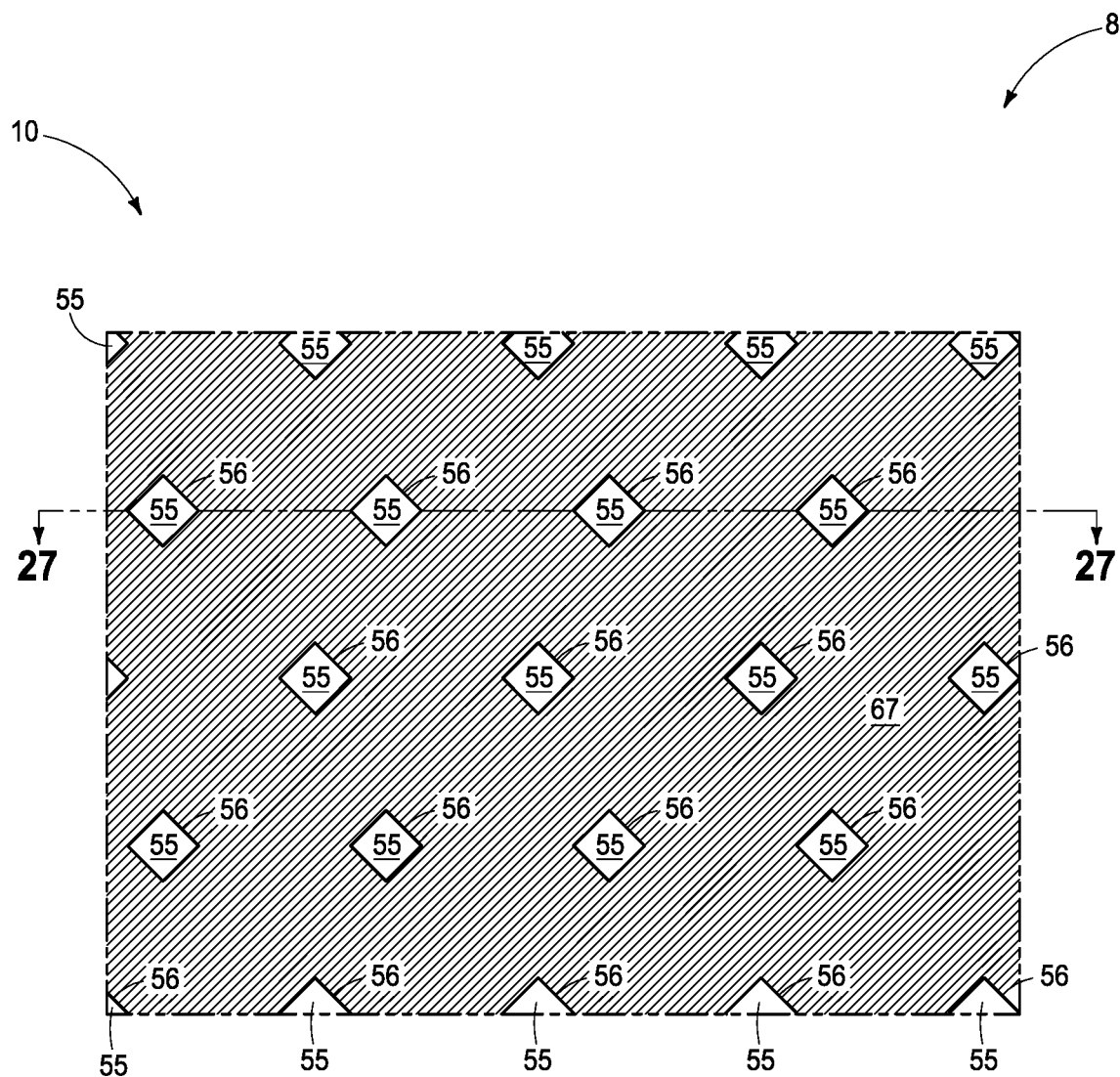

Referring to FIGS. 27 and 28, conductive material 67 has been formed directly above and directly against (e.g., and thereby directly electrically coupled to) conductive vias 36 and directly above fill material 54 and digitline structures 30. In one embodiment, conductive material 67 comprises what may conventionally be considered as a redistribution layer (RDL) or RDL, material.

Figure 29:
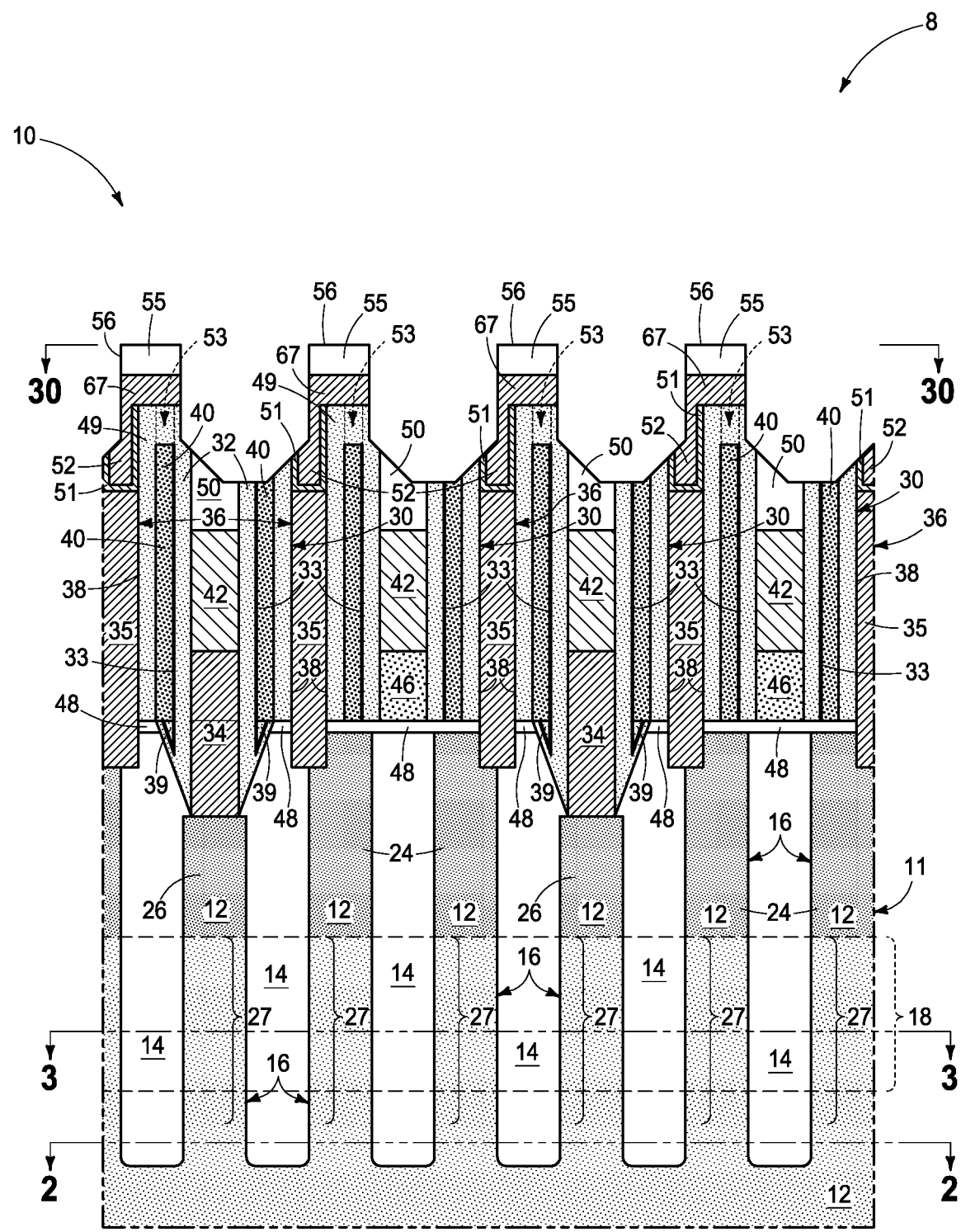
Figure 30:
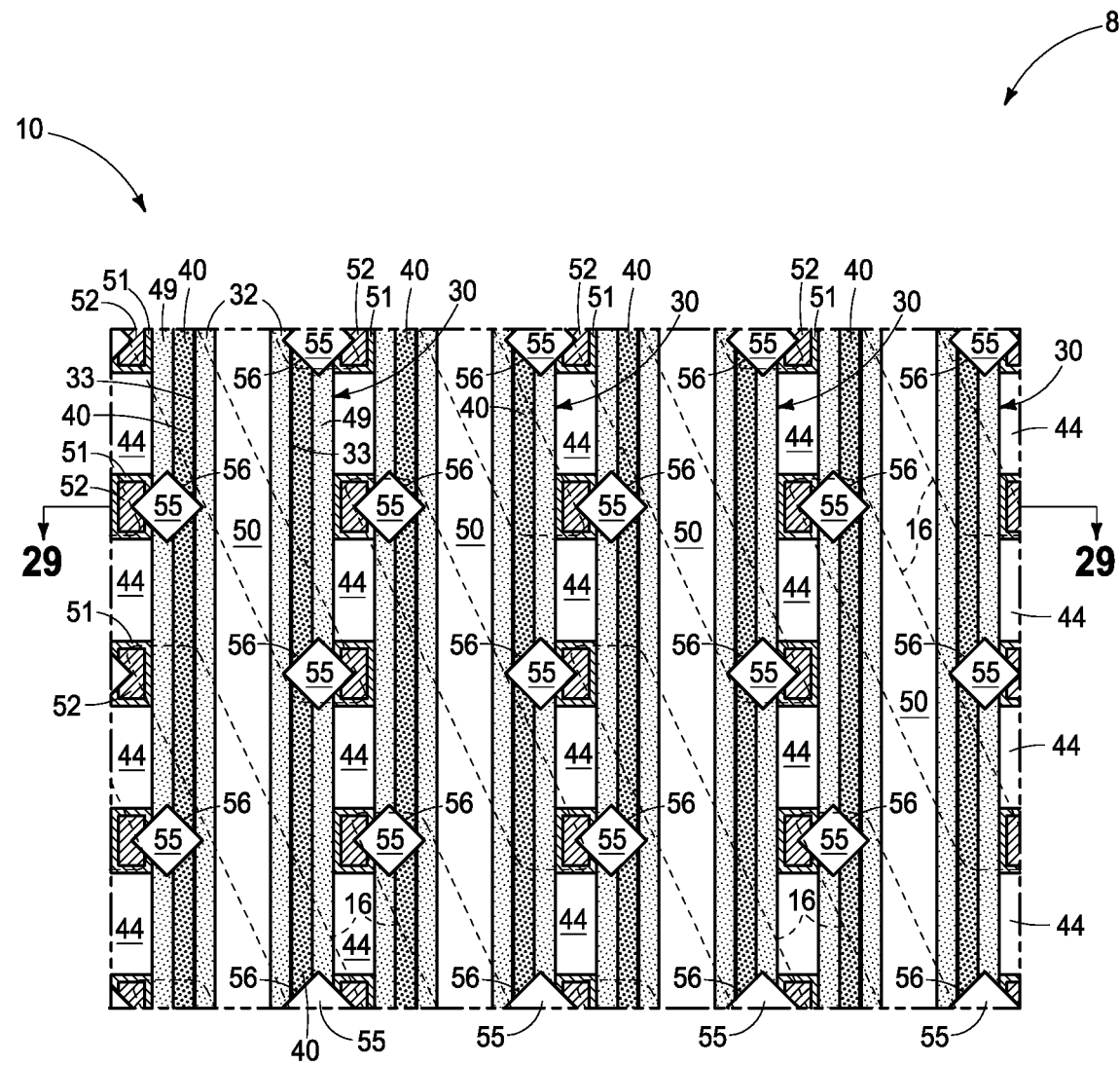
Figure 31:
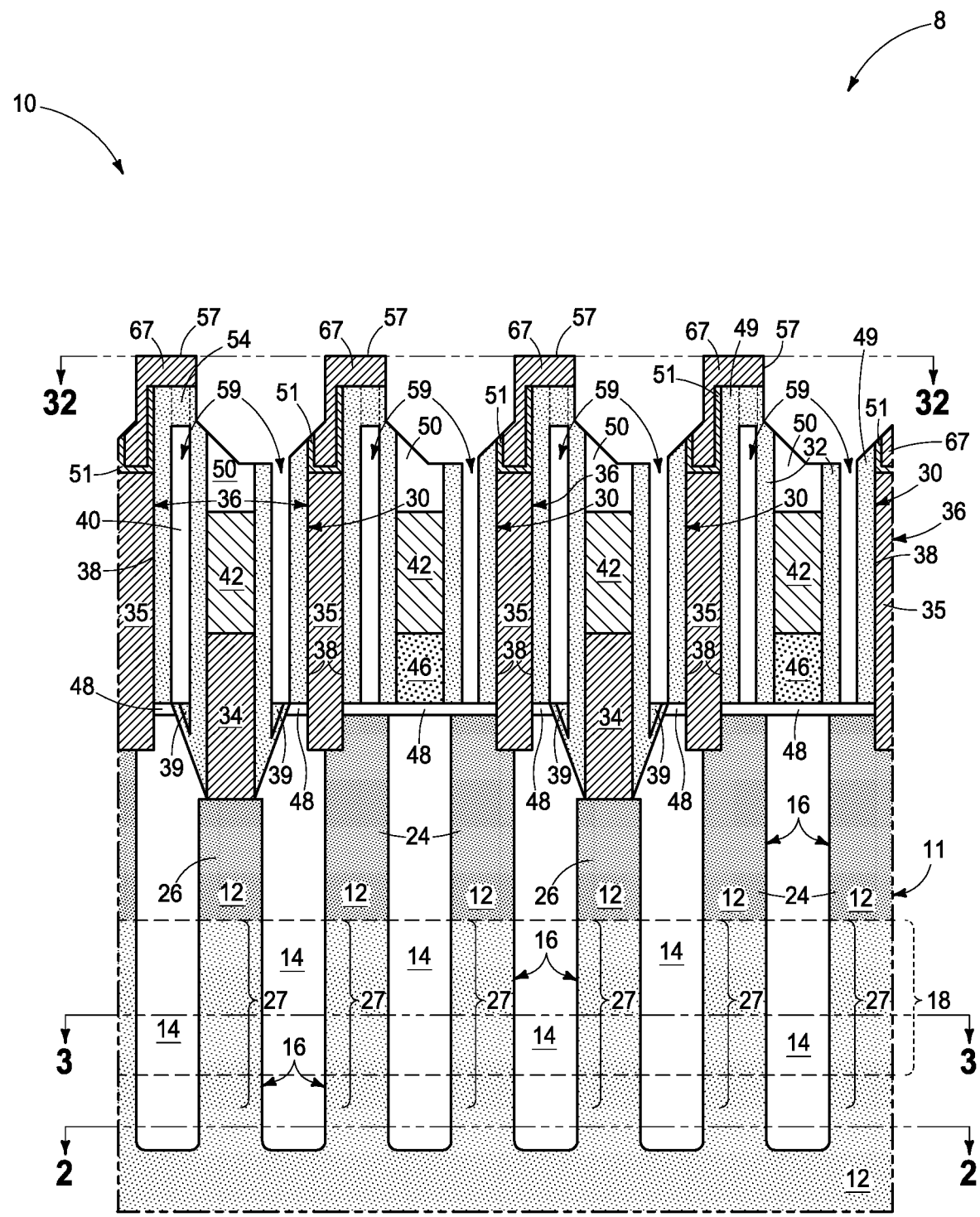
Figure 32:
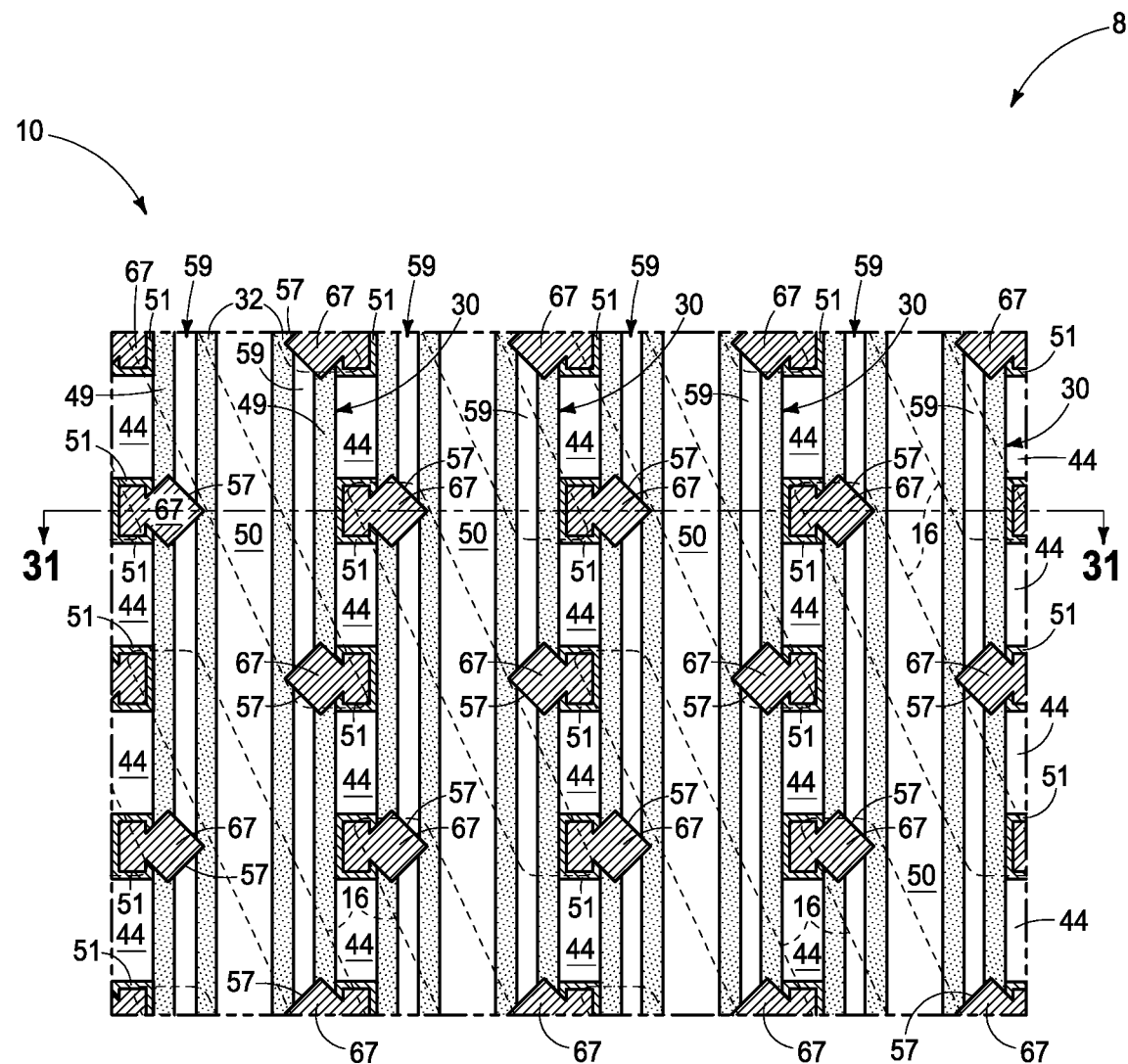
Figure 33:
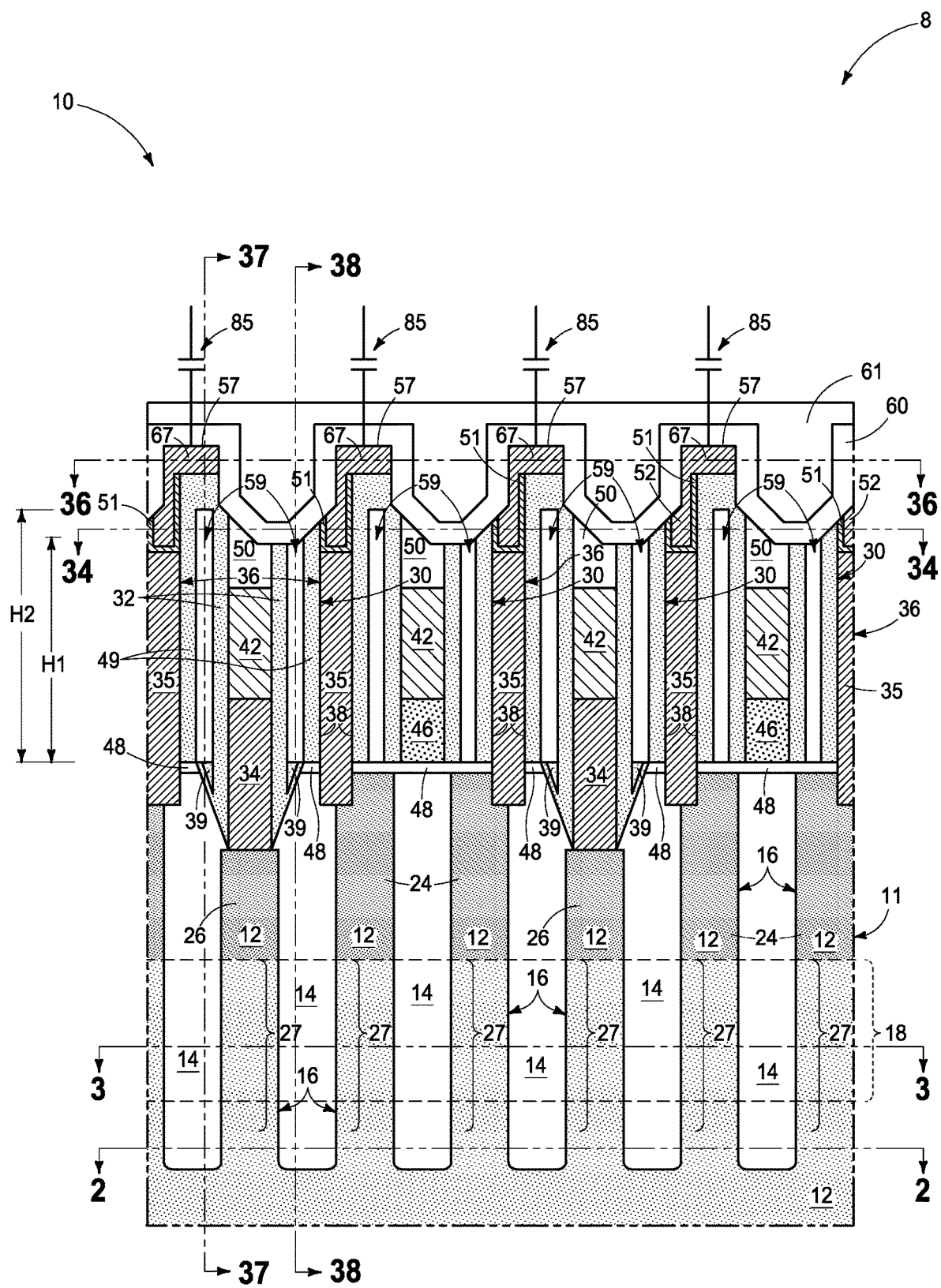
Figure 34:
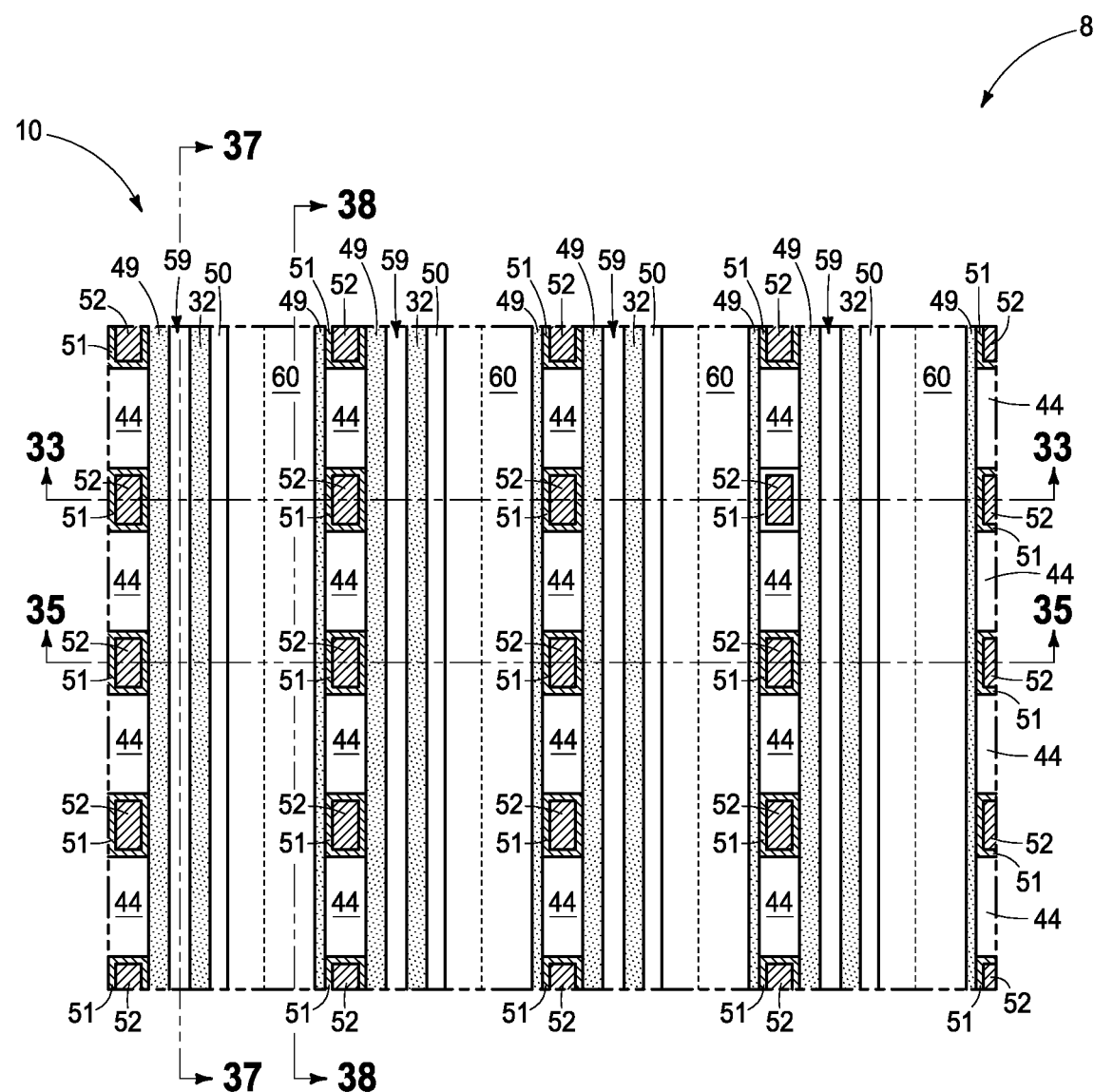
Figure 35:
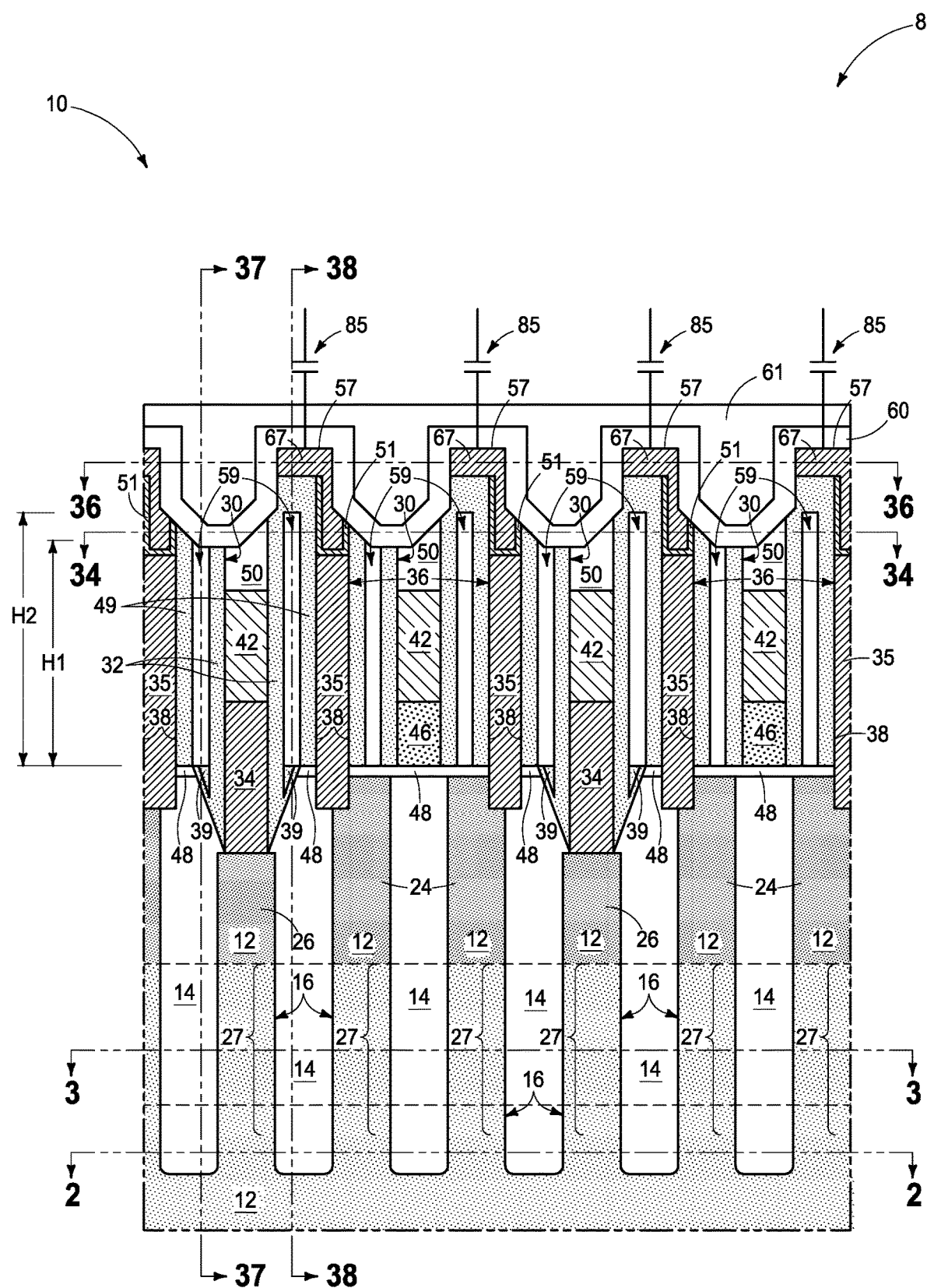
Figure 36:
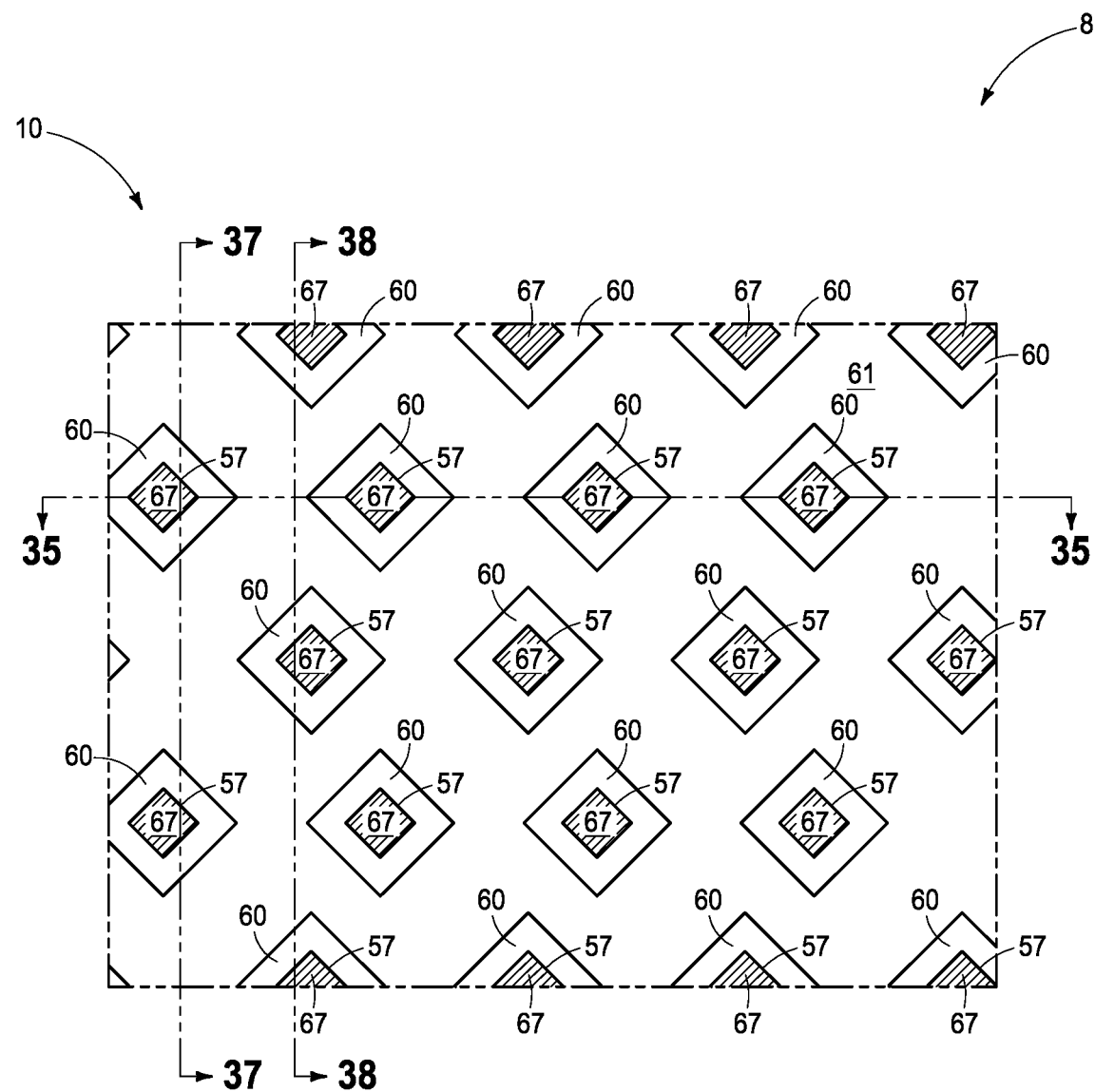
Figure 37:
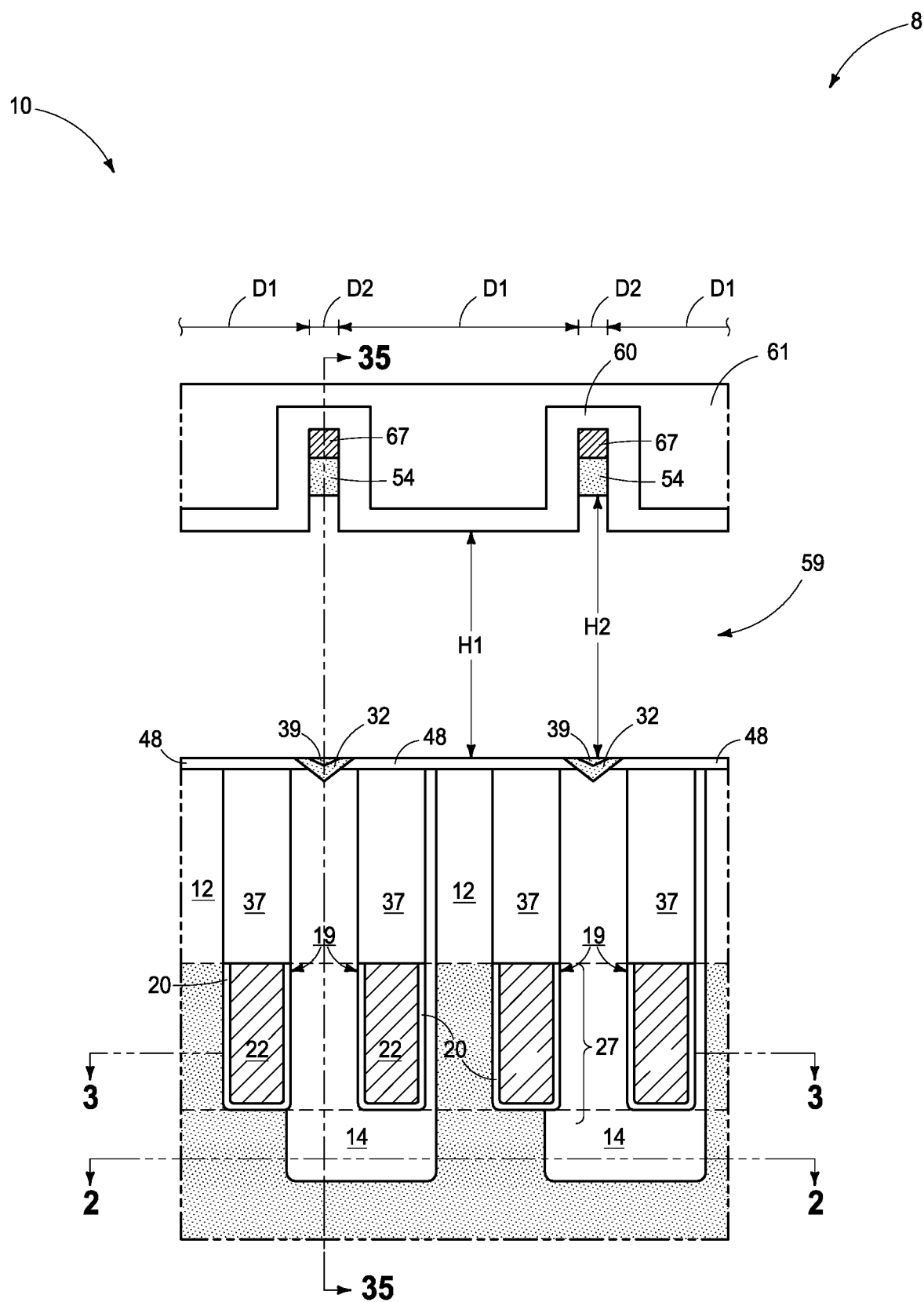
Figure 38:
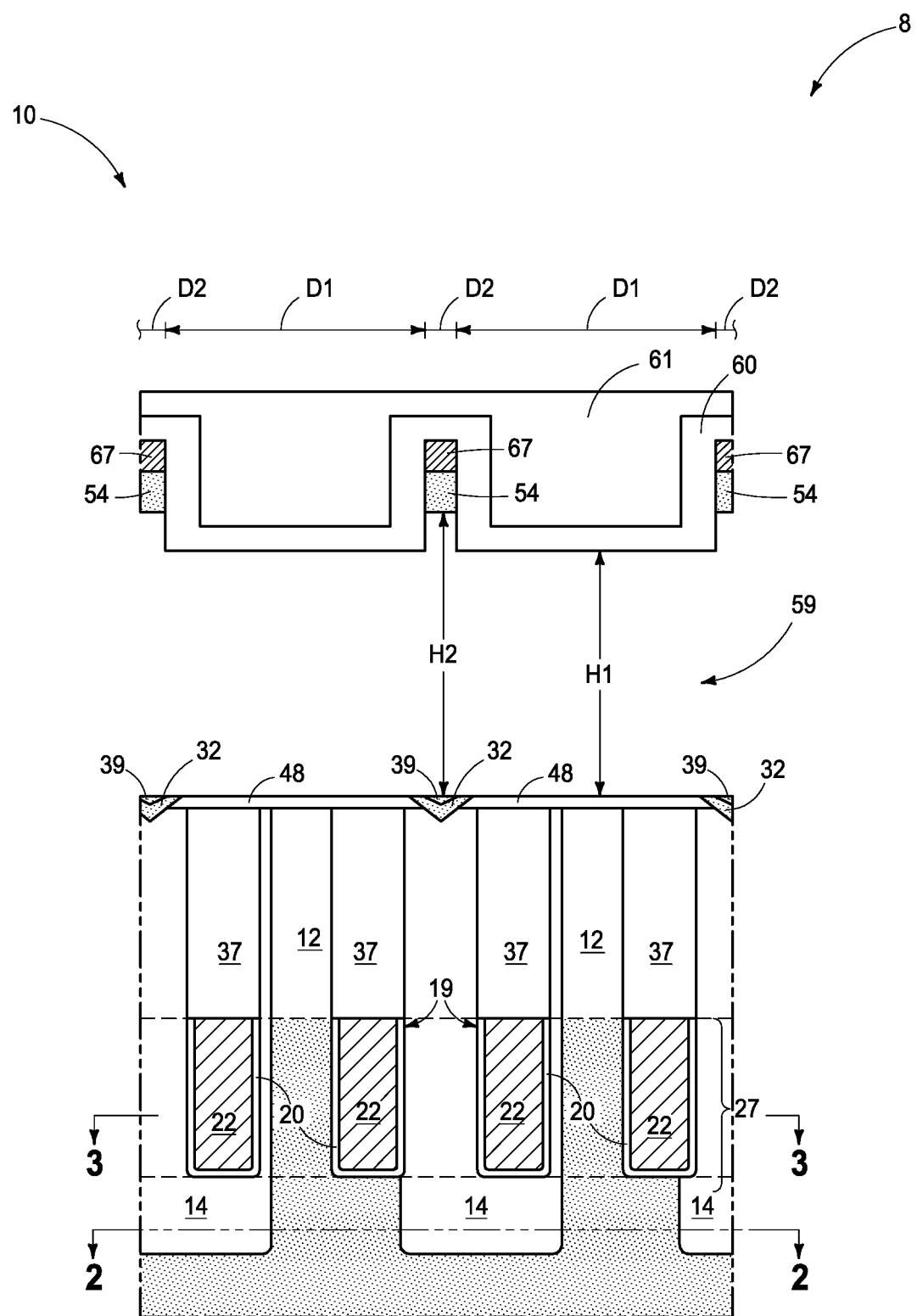

In one embodiment, etching will be conducted through the conductive material and into the digitline structures to expose the sacrificial material. For example, FIGS. 27 and 28 show masking material 55 (e.g., photoresist, antireflective coatings, hard masking materials, etc.) as having been formed atop conductive material 67 and patterned to form example islands 56 of such masking material. FIGS. 29 and 30 show subsequent etching (e.g., dry anisotropic etching using multiple chemistries) which has been conducted through conductive material 67 and into digitline structures 30 ultimately to expose sacrificial material 40. In one embodiment and as shown, after etching through conductive material 67, the etching has been continued through fill material 54 to sacrificial material 40. FIGS. 31 and 32 show subsequent processing whereby masking material 55 (not shown) has been removed. Regardless, the above example processing has resulted in patterning of conductive material 67 (e.g. RDL 67) into separated islands 57 that are individually directly electrically coupled to individual conductive vias 36.

At least some of the unremoved portion of sacrificial material 40, all as shown, is removed (e.g., by wet etching using HF) to form an upwardly-open void space 59 laterally between insulator material 32, 49 on opposing longitudinal sides 38 of individual digitline structures 30.

The void spaces are ultimately covered with insulating material to leave a sealed void space beneath the insulating material on the opposing longitudinal sides of the individual digitline structures. FIGS. 33-38 by way of example show formation of such insulating material in the combination of a physical-vapor-deposited insulating material 60 (e.g., silicon nitride) which seals but does not fill void spaces 59. Some of insulating material may be within void spaces 59 (not shown). This has been followed by, for example, deposition of insulating material 61 (e.g., silicon nitride by ALD and/or chemical vapor deposition), and which has subsequently been planarized back as shown. A plurality of storage elements (e.g., capacitors 85) may be formed that individually directly electrically couple to individual of islands 57 of conductive redistribution layer material 67. Any other attribute(s) or aspect(s) as shown and/or described herein with respect to other embodiments may be used.

An embodiment of the invention includes a method used in forming memory circuitry regardless of whether being of existing construction or future-developed construction. Such a method comprises forming a substrate (e.g., 8) comprising digitline structures (e.g., 30) individually comprising opposing longitudinal sides (e.g., 38) individually comprising sacrificial material (e.g., 40) that is laterally between insulator material (e.g., 32, 49). Conductive vias (e.g., 36) are formed laterally between and spaced longitudinally along the digitline structures. Conductive material (e.g., 67) is formed directly above and directly against the conductive vias and directly above the digitline structures. Etching is conducted through the conductive material and into the digitline structures to expose the sacrificial material. At least some of the sacrificial material is removed to form an upwardly-open void space (e.g., 59) laterally between the insulator material on the opposing longitudinal sides of individual of the digitline structures. The void space is covered with insulating material (e.g., 60, 61) to leave a sealed void space beneath the insulating material on the opposing longitudinal sides of the individual digitline structures. Any other attribute(s) or aspect(s) as shown and/or described herein with respect to other embodiments may be used.

An embodiment of the invention encompasses a method of forming conductive line construction, for example and by way of example only, a conductive line construction 30 and regardless of whether such is a digitline construction or forms any part of memory circuitry. Such a method comprises forming a substrate (e.g., 8) comprising a conductive line structure (e.g., 30) comprising opposing longitudinal sides (e.g., 38) individually comprising a sacrificial material (e.g., 40) that is laterally between insulator material (e.g., 32, 49). Only some of the sacrificial material is removed to form an upwardly-open cavity (e.g., 53) laterally between the insulator material on the opposing longitudinal sides of individual of the conductive line constructions. The cavity is above an unremoved portion of the sacrificial material that is there-below. At least an uppermost portion of the cavity is filled with a fill material (e.g., 54). At least some of the fill material is removed to expose the sacrificial material. At least some of the unremoved portion of the sacrificial material is removed to form an upwardly-open void space (e.g., 59) laterally between the insulator material on the opposing longitudinal sides of the conductive line structure. The void space is covered with insulating material (e.g., 60, 61) to leave a sealed void space beneath the insulating material on the opposing longitudinal sides of the conductive line structure. Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structure and/or device embodiments.

In one embodiment, a construction (e.g., 8) of integrated circuitry (e.g., existing or future-developed circuitry, for example logic circuitry and/or memory circuitry) comprises a horizontal longitudinally-elongated conductive line (e.g., that of material 42, or that of material 42 and material 46 if material 46 is conductive). A horizontal longitudinally-elongated void space (e.g., 59) extends longitudinally along opposing longitudinal sides (e.g., 38) of the conductive line. The void space along each of the opposing longitudinal sides has cyclically varying height (e.g., H1 and H2 in FIGS. 33, 35, 37, and 38) longitudinally along the conductive line. In one embodiment, the integrated circuitry comprises memory circuitry and the conductive line is a digitline thereof. In one embodiment, the cyclically varying height has a repeating cycle of two heights (e.g., H1 and H2) and in one such embodiment wherein a shorter of the two heights (e.g., H1) is longitudinally longer (e.g., D1 in FIGS. 37 and 38) along the conductive line than is a taller (e.g., H2) of the two heights (e.g., D2 in FIGS. 37 and 38). In one embodiment, the cyclically varying height of the opposing void spaces has a repeating cycle that is the same as one another, and in one such embodiment and as shown wherein the same repeating cycle of the opposing void spaces are longitudinally offset relative one another (e.g., as is apparent from FIGS. 36-38). In one embodiment, the void spaces are everywhere taller than the conductive line. Any other attribute(s) or aspect(s) as shown and/or described herein with respect to other embodiments may be used.

An embodiment of the invention comprises DRAM circuitry (e.g., 10). Such comprises a substrate (e.g., 8) comprising pairs of transistors (e.g., 25) individually comprising a pair of source/drain regions (e.g., 24, 26). A channel region (e.g., 27) is between the pair of source/drain regions. A conductive gate (e.g., 22) is operatively proximate the channel region. A gate insulator (e.g., 20) is between the conductive gate and the channel region. One of source/drain regions (e.g., 26) of the pair of source/drain regions in individual of the pair of transistors is laterally between the conductive gates in and is shared by the individual pairs of transistors. The others of the source/drain regions (e.g., 24) of the pair of source/drain regions are not shared in the individual pairs of transistors. Conductive vias (e.g., 36) are individually directly electrically coupled to one of the other source/drain regions in the individual pairs of transistors. A storage element (e.g., a capacitor 85) is directly electrically coupled to individual of the conductive vias. Digitline structures (e.g., 30) are individually directly electrically coupled to the one shared source/drain region of multiple of the individual pairs of transistors. The digitline structures individually comprise a horizontal longitudinally-elongated conductive line (e.g., that of conductive material 42, or that of material 42 and material 46 if material 46 is conductive). A horizontal longitudinally-elongated void space (e.g., 59) extends longitudinally along opposing longitudinal sides of the conductive line. The void space along each of the opposing longitudinal sides has cyclically varying height (e.g., H1 and H2) longitudinally along the conductive line. In one embodiment, the DRAM circuitry comprises a redistribution-layer island (e.g., 57) above and directly electrically coupled to individual of the conductive vias, with individual of the void spaces being tallest directly under the islands. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION in some embodiments, a method of forming a conductive line construction comprises forming a substrate comprising a conductive line structure comprising opposing longitudinal sides individually comprising a sacrificial material that is laterally between insulator material. Some of the sacrificial material is removed to form an upwardly-open cavity laterally between the insulator material on the opposing longitudinal sides of individual of the conductive line structures. The cavity is above an unremoved portion of the sacrificial material that is there-below. At least an uppermost portion of the cavity is filled with a fill material. At least some of the fill material is removed to expose the sacrificial material. At least some of the unremoved portion of the sacrificial material is removed to form an upwardly-open void space laterally between the insulator material on the opposing longitudinal sides of the conductive line structure. The void space is covered with insulating material to leave a sealed void space beneath the insulating material on the opposing longitudinal sides of the conductive line structure.

In some embodiments, a method used in forming memory circuitry comprises forming a substrate comprising digitline structures individually comprising opposing longitudinal sides individually comprising sacrificial material that is laterally between insulator material. Conductive vias are formed laterally between and spaced longitudinally along the digitline structures. Conductive material is formed directly above and directly against the conductive vias and directly above the digitline structures. The conductive material is etched through and etching is conducted into the digitline structures to expose the sacrificial material. At least some of the sacrificial material is removed to form an upwardly-open void space laterally between the insulator material on the opposing longitudinal sides of individual of the digitline structures. The void space is covered with insulating material to leave a sealed void space beneath the insulating material on the opposing longitudinal sides of the individual digitline structures.

In some embodiments, a method of forming DRAM circuitry comprises forming a substrate to comprise pairs of transistors. The pairs individually comprise a pair of source/drain regions, a channel region between the pair of source/drain regions, a conductive gate operatively proximate the channel region, and a gate insulator between the conductive gate and the channel region. One of the source/drain regions of the pair of source/drain regions in individual of the pairs of transistors is laterally between the conductive gates in and is shared by the individual pairs of transistors. The others of the source/drain regions of the pair of source/drain regions are not being shared in the individual pairs of transistors. Digitline structures are formed that are individually directly electrically coupled to the one shared source/drain region of multiple of the individual pairs of transistors. The digitline structures individually comprise opposing longitudinal sides individually comprising a sacrificial material that is laterally between insulator material. Conductive vias are formed laterally between and spaced longitudinally along the digitline structures. Individual of the conductive vias are directly electrically coupled to one of the other source/drain regions in the individual pairs of transistors. After forming the conductive vias, only some of the sacrificial material is removed to form an upwardly-open cavity laterally between the insulator material on the opposing longitudinal sides of individual of the digitline structures. The cavity is above an unremoved portion of the sacrificial material that is there-below. At least an uppermost portion of the cavity is filled with a fill material. Conductive material of a redistribution layer is formed directly above the fill material, the digitline structures, and the conductive vias. The conductive material is directly coupled to the conductive vias. The conductive material is etched through and etching is conducted into the digitline structures to expose the sacrificial material and to pattern the redistribution layer into separated islands that are individually directly electrically coupled to individual of the conductive vias. After the etching, at least some of the fill material is removed to expose the sacrificial material. At least some of the unremoved portion of the sacrificial material is removed to form an upwardly-open void space laterally between the insulator material on the opposing longitudinal sides of the individual digitline structures. The void space is covered with insulating material to leave a sealed void space beneath the insulating material on the opposing longitudinal sides of the individual digitline structures. A plurality of storage elements is formed that individually directly electrically couple to individual of the islands.

In some embodiments, a construction of integrated circuitry comprises a horizontal longitudinally-elongated conductive line. A horizontal longitudinally-elongated void space extends longitudinally along opposing longitudinal sides of the conductive line. The void space along each of the opposing longitudinal sides has cyclically varying height longitudinally along the conductive line.

In some embodiments, DRAM circuitry comprises a substrate comprising pairs of transistors. The pairs individually comprise a pair of source/drain regions, a channel region between the pair of source/drain regions, a conductive gate operatively proximate the channel region, and a gate insulator between the conductive gate and the channel region. One of the source/drain regions of the pair of source/drain regions in individual of the pairs of transistors is laterally between the conductive gates in and is shared by the individual pairs of transistors. The others of the source/drain regions of the pair of source/drain regions are not being shared in the individual pairs of transistors. Conductive vias are individually directly electrically coupled to one of the other source/drain regions in the individual pairs of transistors. A storage element is directly electrically coupled to individual of the conductive vias. Digitline structures are individually directly electrically coupled to the one shared source/drain region of multiple of the individual pairs of transistors. The digitline structures individually comprise a horizontal longitudinally-elongated conductive line. A horizontal longitudinally-elongated void space extends longitudinally along opposing longitudinal sides of the conductive line. The void space along each of the opposing longitudinal sides has cyclically varying height longitudinally along the conductive line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a conductive line construction, comprising:

forming a substrate comprising a conductive line structure comprising opposing longitudinal sides individually comprising a sacrificial material that is laterally between insulator material;

removing only some of the sacrificial material to form an upwardly-open cavity laterally between the insulator material on the opposing longitudinal sides of the conductive line structure, the cavity being above an unremoved portion of the sacrificial material that is there-below;

filling at least an uppermost portion of the cavity with a fill material;

removing at least some of the fill material to expose the sacrificial material;

removing at least some of the unremoved portion of the sacrificial material to form an upwardly-open void space laterally between the insulator material on the opposing longitudinal sides of the conductive line structure; and covering the void space with insulating material to leave a sealed void space beneath the insulating material on the opposing longitudinal sides of the conductive line structure.

2. The method of claim 1 wherein the insulator material is of the same composition on both sides of the sacrificial material.

3. The method of claim 1 wherein the sacrificial material is insulative.

4. The method of claim 1 wherein the fill material is of different composition from that of the sacrificial material.

5. The method of claim 4 wherein one of the sacrificial material and the fill material is silicon dioxide and the other of the sacrificial material and the fill material is silicon nitride.

6. The method of claim 1 wherein said filling is of all of the cavity with the fill material.

7. The method of claim 1 wherein said removing at least some of the fill material to expose the sacrificial material comprising removes all of said fill material that is within the cavity.

8. The method of claim 7 wherein said filling is of all of the cavity with the fill material.

9. The method of claim 1 wherein said removing at least some of the unremoved portion of the sacrificial material to form an upwardly-open void space removes all of said unremoved portion of the sacrificial material.

10. The method of claim 1 wherein forming the sides to comprise the sacrificial material between the insulating material comprises:

forming a first layer of the insulator material along and directly above conductive material of the conductive line structure;

forming an etch-stop layer directly above the first layer of insulator material, the etch-stop layer being of different composition from that of the first layer of insulator material;

forming a second layer of the insulator material directly above the etch-stop layer;

etching the second layer selectively relative to the etch-stop layer;

after the etching, forming the sacrificial material over the first layer of the insulator material; and forming a third layer of the insulator material over the sacrificial material.

11. The method of claim 10 wherein the first, second, and third layers of the insulator material are all of the same composition relative one another.

12. The method of claim 10 wherein the etch-stop layer and the sacrificial material are of the same composition relative one another.

13. A method used in forming memory circuitry, comprising:

forming a substrate comprising digitline structures individually comprising opposing longitudinal sides individually comprising sacrificial material that is laterally between insulator material;

forming conductive vias laterally between and spaced longitudinally along the digitline structures;

forming conductive material directly above and directly against the conductive vias and directly above the digitline structures;

etching through the conductive material and into the digitline structures to expose the sacrificial material;

removing at least some of the sacrificial material to form an upwardly-open void space laterally between the insulator material on the opposing longitudinal sides of individual of the digitline structures; and covering the void space with insulating material to leave a sealed void space beneath the insulating material on the opposing longitudinal sides of the individual digitline structures.

14. The method of claim 13 wherein the etching forms islands of the conductive material that are individually directly electrically coupled to individual of the conductive vias.

15. The method of claim 14 comprising forming a plurality of a storage elements that are individually directly electrically coupled to individual of the islands.

16. The method of claim 13 wherein said removing is of all of the sacrificial material that is laterally between the insulator material.

17. The method of claim 13 comprising:

before forming the conductive material, removing only some of the sacrificial material to form an upwardly-open cavity laterally between the insulator material on the opposing longitudinal sides of individual of the digitline structures, the cavity being above an unremoved portion of the sacrificial material that is there-below;

filling at least an uppermost portion of the cavity with a fill material;

forming the conductive material directly above the fill material; and said etching being through the conductive material being continued through said fill material.

18. A method of forming DRAM circuitry, comprising:

forming a substrate to comprise pairs of transistors individually comprising:

a pair of source/drain regions;

a channel region between the pair of source/drain regions;

a conductive gate operatively proximate the channel region;

a gate insulator between the conductive gate and the channel region; and one of the source/drain regions of the pair of source/drain regions in individual of the pairs of transistors being laterally between the conductive gates in and being shared by the individual pairs of transistors, the others of the source/drain regions of the pair of source/drain regions not being shared in the individual pairs of transistors;

forming digitline structures that are individually directly electrically coupled to the one shared source/drain region of multiple of the individual pairs of transistors, the digitline structures individually comprising opposing longitudinal sides individually comprising a sacrificial material that is laterally between insulator material;

forming conductive vias laterally between and spaced longitudinally along the digitline structures, individual of the conductive vias being directly electrically coupled to one of the other source/drain regions in the individual pairs of transistors;

after forming the conductive vias, removing only some of the sacrificial material to form an upwardly-open cavity laterally between the insulator material on the opposing longitudinal sides of individual of the digitline structures, the cavity being above an unremoved portion of the sacrificial material that is there-below;

filling at least an uppermost portion of the cavity with a fill material;

forming conductive material of a redistribution layer directly above the fill material, the digitline structures, and the conductive vias; the conductive material being directly coupled to the conductive vias;

etching through the conductive material and into the digitline structures to expose the sacrificial material and to pattern the redistribution layer into separated islands that are individually directly electrically coupled to individual of the conductive vias;

after the etching, removing at least some of the fill material to expose the sacrificial material;

removing at least some of the unremoved portion of the sacrificial material to form an upwardly-open void space laterally between the insulator material on the opposing longitudinal sides of the individual digitline structures;

covering the void space with insulating material to leave a sealed void space beneath the insulating material on the opposing longitudinal sides of the individual digitline structures; and forming a plurality of a storage elements that are individually directly electrically coupled to individual of the islands.

19. The method of claim 18 wherein the pairs of transistors comprise pairs of recessed access devices individually comprising:

the conductive gate being in a trench in semiconductive material;

the gate insulator being along sidewalls and a base of the trench between the conductive gate and the semiconductive material;

the pair of source/drain regions being in upper portions of the semiconductive material on opposing sides of the trench; and the channel region being in the semiconductive material below the pair of source/drain regions along the trench sidewalls and around the trench base.

* * * * *